United States Patent
Tabata et al.

(10) Patent No.: US 8,287,069 B2
(45) Date of Patent: Oct. 16, 2012

(54) HEAD DRIVE DEVICE AND DRIVE CONTROL METHOD OF INK JET PRINTER, AND INK JET PRINTER

(75) Inventors: Kunio Tabata, Shiojiri (JP); Atsushi Oshima, Shiojiri (JP); Osamu Shinkawa, Chino (JP); Toshiyuki Suzuki, Shiojiri (JP); Tomoki Hatano, Higashiomi (JP)

(73) Assignee: Seiko Epson Corporation, Tokyo (JP)

( * ) Notice: Subject to any disclaimer, the term of this patent is extended or adjusted under 35 U.S.C. 154(b) by 579 days.

(21) Appl. No.: 12/158,591

(22) PCT Filed: Dec. 22, 2006

(86) PCT No.: PCT/JP2006/325628
§ 371 (c)(1),
(2), (4) Date: Jul. 16, 2009

(87) PCT Pub. No.: WO2007/072945
PCT Pub. Date: Jun. 28, 2007

(65) Prior Publication Data
US 2009/0303271 A1 Dec. 10, 2009

(30) Foreign Application Priority Data
Dec. 22, 2005 (JP) ................................. 2005-369449

(51) Int. Cl.
*B41J 29/38* (2006.01)
(52) U.S. Cl. ............ 347/10; 347/5; 347/6; 347/7; 347/8; 347/9; 347/11; 347/12; 347/13
(58) Field of Classification Search ................. 347/5–13
See application file for complete search history.

(56) References Cited

U.S. PATENT DOCUMENTS

| 2,915,589 | A | 12/1959 | Plant |
| 4,254,439 | A | 3/1981 | Fowler et al. |
| 4,992,749 | A | 2/1991 | Tokumo et al. |
| 5,262,733 | A | 11/1993 | Nakajima et al. |

(Continued)

FOREIGN PATENT DOCUMENTS

EP 1594224 11/2005

(Continued)

OTHER PUBLICATIONS

U.S. Appl. No. 12/752,367, filed Apr. 1, 2010, Oshima.

(Continued)

*Primary Examiner* — Ryan Lepisto
*Assistant Examiner* — Guy Anderson
(74) *Attorney, Agent, or Firm* — Maschoff Gilmore & Israelsen

(57) ABSTRACT

A head drive apparatus of an ink jet printer having: a plurality of nozzles for jetting liquid drops that are provided for an ink jet head; a plurality of actuators provided in correspondence to the nozzles; and a drive unit that applies a drive signal to the actuators, wherein the drive unit comprising: a drive waveform generator that generates a drive waveform signal being standard of a signal to control drive of the actuators; a modulator that modulates a pulse of a drive waveform signal generated by the drive waveform generator; a digital power amplifier for amplifying power of a modulated signal subjected to the pulse modulation by the modulator; and a low pass filter for smoothing an amplified digital signal subjected to the power amplification by the digital power amplifier and supplying the signal as a drive signal to the actuators.

9 Claims, 18 Drawing Sheets

U.S. PATENT DOCUMENTS

| | | | |
|---|---|---|---|
| 5,283,658 A | 2/1994 | Hayashi et al. | |
| 5,406,314 A | 4/1995 | Kuehnle | |
| 5,475,405 A | 12/1995 | Widder et al. | |
| 5,675,296 A | 10/1997 | Tomikawa | |
| 5,894,314 A | 4/1999 | Tajika et al. | |
| 6,133,844 A | 10/2000 | Ahne et al. | |
| 6,267,519 B1 | 7/2001 | Otsuki et al. | |
| 6,312,076 B1 | 11/2001 | Taki et al. | |
| 6,312,096 B1 | 11/2001 | Koitabashi et al. | |
| 6,320,605 B1 | 11/2001 | Ikeda et al. | |
| 6,344,811 B1 | 2/2002 | Melanson | |
| 6,364,443 B1 | 4/2002 | Katano et al. | |
| 6,431,676 B2 | 8/2002 | Asauchi et al. | |
| 6,443,547 B1 | 9/2002 | Takahashi et al. | |
| 6,454,377 B1 | 9/2002 | Ishizaki | |
| 6,457,794 B1 * | 10/2002 | Tajika et al. | 347/11 |
| 6,474,762 B2 * | 11/2002 | Taki et al. | 347/10 |
| 6,652,055 B2 | 11/2003 | Oikawa | |
| 6,739,686 B2 | 5/2004 | Imai | |
| 6,776,469 B2 | 8/2004 | Nozawa | |
| 7,038,534 B2 | 5/2006 | Hanzlik | |
| 7,083,274 B2 | 8/2006 | Morita | |
| 7,111,755 B2 | 9/2006 | Koyama et al. | |
| 7,244,007 B2 | 7/2007 | Ishizaki | |
| 7,252,355 B2 | 8/2007 | Umeda | |
| 7,357,496 B2 | 4/2008 | Silverbrook et al. | |
| 7,384,128 B2 | 6/2008 | Sheahan et al. | |
| 7,571,989 B2 | 8/2009 | Ishizaki | |
| 7,576,763 B2 | 8/2009 | Fitzpatrick et al. | |
| 7,717,530 B2 | 5/2010 | Oshima | |
| 7,731,317 B2 | 6/2010 | Oshima | |
| 7,758,140 B2 | 7/2010 | Oshima et al. | |
| 2001/0040595 A1 * | 11/2001 | Taki et al. | 347/9 |
| 2002/0113832 A1 | 8/2002 | Kanematsu et al. | |
| 2002/0142733 A1 | 10/2002 | Nishinakagawa | |
| 2002/0163458 A1 | 11/2002 | Jin | |
| 2003/0112297 A1 | 6/2003 | Hiratsuka et al. | |
| 2003/0231179 A1 | 12/2003 | Suzuki | |
| 2004/0047477 A1 | 3/2004 | Bank et al. | |
| 2004/0119770 A1 | 6/2004 | Tamura | |
| 2004/0227807 A1 | 11/2004 | Horiuchi | |
| 2004/0233241 A1 | 11/2004 | Salacz | |
| 2005/0116977 A1 * | 6/2005 | Shinkawa et al. | 347/14 |
| 2005/0231179 A1 * | 10/2005 | Ishizaki | 323/234 |
| 2005/0248399 A1 | 11/2005 | Kurokawa | |
| 2006/0132231 A1 | 6/2006 | Ishii et al. | |
| 2006/0181342 A1 | 8/2006 | Kanoh | |
| 2007/0079710 A1 | 4/2007 | Ishizaki | |
| 2007/0165074 A1 | 7/2007 | Ishizaki | |
| 2008/0018683 A1 | 1/2008 | Oshima et al. | |
| 2008/0018685 A1 | 1/2008 | Tabata et al. | |
| 2008/0018686 A1 | 1/2008 | Oshima et al. | |
| 2008/0018687 A1 | 1/2008 | Tabata et al. | |
| 2008/0100652 A1 | 5/2008 | Oshima et al. | |
| 2008/0186350 A1 | 8/2008 | Oshima et al. | |
| 2008/0198191 A1 | 8/2008 | Oshima | |
| 2008/0218545 A1 | 9/2008 | Oshima et al. | |
| 2009/0033698 A1 | 2/2009 | Suzuki et al. | |
| 2009/0066739 A1 | 3/2009 | Tabata et al. | |
| 2009/0140780 A1 | 6/2009 | Miyazaki et al. | |
| 2009/0174738 A1 | 7/2009 | Oshima | |
| 2009/0213152 A1 | 8/2009 | Tabata et al. | |
| 2009/0267979 A1 | 10/2009 | Tabata et al. | |
| 2009/0289980 A1 | 11/2009 | Tabata et al. | |
| 2010/0091059 A1 | 4/2010 | Oshima et al. | |
| 2010/0097419 A1 | 4/2010 | Oshima | |
| 2010/0118078 A1 | 5/2010 | Oshima et al. | |
| 2010/0188452 A1 | 7/2010 | Oshima | |
| 2010/0220133 A1 | 9/2010 | Oshima et al. | |
| 2011/0102486 A1 | 5/2011 | Tabata et al. | |
| 2011/0109674 A1 | 5/2011 | Oshima et al. | |

FOREIGN PATENT DOCUMENTS

| | | |
|---|---|---|
| JP | 06-041208 | 10/1988 |
| JP | 63-247059 | 10/1988 |
| JP | 02-262705 | 10/1990 |
| JP | 03-147446 A | 6/1991 |
| JP | 05-077456 | 3/1993 |
| JP | 05-199044 | 8/1993 |
| JP | 09-234865 A | 9/1997 |
| JP | 09-300618 A | 11/1997 |
| JP | 09-308264 | 11/1997 |
| JP | 10-081013 | 3/1998 |
| JP | 10-210757 A | 8/1998 |
| JP | 11-058733 A | 3/1999 |
| JP | 11-204850 | 7/1999 |
| JP | 11-204850 A | 7/1999 |
| JP | 2000-117980 A | 4/2000 |
| JP | 2000-238262 | 9/2000 |
| JP | 2000-245162 | 9/2000 |
| JP | 2001-121697 | 5/2001 |
| JP | 2001-268922 A | 9/2001 |
| JP | 2002-204595 A | 7/2002 |
| JP | 2002-536903 A | 10/2002 |
| JP | 2003-001824 | 1/2003 |
| JP | 2003-237068 | 8/2003 |
| JP | 2004-048886 A | 2/2004 |
| JP | 2004-306434 | 11/2004 |
| JP | 2005-035062 | 2/2005 |
| JP | 2005-065068 | 3/2005 |
| JP | 2005-075475 | 3/2005 |
| JP | 2005-131928 | 5/2005 |
| JP | 2005-322957 | 11/2005 |
| JP | 2005-329710 | 12/2005 |
| JP | 2006-025151 | 1/2006 |
| JP | 2006-231882 | 9/2006 |
| JP | 2006-256151 | 9/2006 |
| JP | 2006-272907 | 10/2006 |
| JP | 2006-272907 A | 10/2006 |
| JP | 2006-304490 A | 11/2006 |
| JP | 2007-069555 | 3/2007 |
| JP | 2007-096364 | 4/2007 |
| JP | 2007-144867 | 6/2007 |
| JP | 2007-168172 | 7/2007 |
| JP | 2007-190708 | 8/2007 |
| JP | 2008-049698 | 3/2008 |
| JP | 2008-049699 | 3/2008 |
| JP | 2008-087467 | 4/2008 |
| WO | 00/46919 A2 | 8/2000 |

OTHER PUBLICATIONS

U.S. Appl. No. 11/780,357, May 12, 2010, Final Office Action.
U.S. Appl. No. 11/849,582, Apr. 19, 2010, Notice of Allowance.
U.S. Appl. No. 11/923,448, Apr. 28, 2010, Final Office Action.
U.S. Appl. No. 11/780,379, Mar. 3, 2010, Office Action.
U.S. Appl. No. 12/351,472, Jan. 4, 2010, Notice of Allowance.
U.S. Appl. No. 12/340,940, Apr. 12, 2010, Notice of Allowance.
U.S. Appl. No. 12/161,148, Mar. 30, 2010, Office Action.
U.S. Appl. No. 11/780,379, Aug. 20, 2010, Final Office Action.
U.S. Appl. No. 12/161,148, Sep. 16, 2010, Final Office Action.
U.S. Appl. No. 12/161,201, Sep. 28, 2010, Office Action.
U.S. Appl. No. 12/509,915, Sep. 30, 2010, Office Action.
U.S. Appl. No. 12/637,412, Aug. 23, 2010, Office Action.
U.S. Appl. No. 12/752,367, Oct. 8, 2010, Office Action.
U.S. Appl. No. 12/161,201, filed Jul. 17, 2008, Oshima et al.
U.S. Appl. No. 12/637,412, filed Dec. 14, 2009, Oshima et al.
U.S. Appl. No. 12/689,926, filed Jan. 19, 2010, Oshima et al.
U.S. Appl. No. 11/780,301, Jun. 27, 2008, Office Action.
U.S. Appl. No. 11/780,301, Feb. 20, 2009, Final Office Action.
U.S. Appl. No. 11/780,301, Jun. 16, 2009, Notice of Allowance.
U.S. Appl. No. 11/780,357, Oct. 28, 2009, Office Action.
U.S. Appl. No. 11/780,390, Apr. 8, 2009, Notice of Allowance.
U.S. Appl. No. 11/849,582, May 28, 2008, Office Action.
U.S. Appl. No. 11/849,582, Dec. 30, 2009, Final Office Action.
U.S. Appl. No. 11/923,448, Nov. 27, 2009, Office Action.
Notice of Allowance dated Jun. 14, 2011 as received in related U.S. Appl. No. 12/637,412.
Office Action dated Dec. 27, 2010 as received in related U.S. Appl. No. 12/026,129.
Office Action dated Jun. 14, 2011 as received in related U.S. Appl. No. 12/026,129.
European Search Report dated Jan. 28, 2010 received in European Application No. EP 07706915.1.

Office Action dated Mar. 4, 2011 as received in related U.S. Appl. No. 11/780,357.
Office Action dated Mar. 4, 2011 as received in related U.S. Appl. No. 11/780,379.
Office Action dated Dec. 27, 2010 as received in related U.S. Appl. No. 12/027,175.
Office Action dated Nov. 30, 2010 as received in related U.S. Appl. No. 12/689,926.
Notice of Allowance dated Apr. 5, 2010 as received in related U.S. Appl. No. 11/972,542.
Notice of Allowance dated Dec. 17, 2010 as received in related U.S. Appl. No. 12/498,296.
United States Office Action dated Oct. 11, 2011 as received in related U.S. Appl. No. 12/624,206.
Japanese Office Action dated Nov. 1, 2011 as received in related U.S. Appl. No. 2007-181649.
Notice of Allowance dated Nov. 25, 2011 as received in related U.S. Appl. No. 12/637,412.
United States Office Action mailed Jan. 9, 2012 as received in U.S. Appl. No. 12/389,525.
United States Notice of Allowance mailed Jan. 13, 2012 as received in U.S. Appl. No. 12/161,201.
Japanese Office Action mailed Jan. 17, 2012 as received in Application No. 2007-184438.
United States Office Action mailed Apr. 14, 2011 as received in U.S. Appl. No. 12/161,201.
Japanese Office Action mailed Feb. 14, 2012 as received in Application No. 2007-555945.
Japanese Office Action mailed Feb. 14, 2012 as received in Application No. 2007-184439.

* cited by examiner

HEAD DRIVE DEVICE AND DRIVE CONTROL METHOD OF INK JET PRINTER, AND INK JET PRINTER

BACKGROUND

1. Technical Field

The present invention relates to an ink jet printer in which a plurality of nozzles jet minute ink drops of liquid ink of a plurality of colors and particles of ink (ink dots) are formed on a print medium to draw pre-determined characters and images.

2. Related Art

An ink jet printer as in the above generally accomplishes low-cost and high-quality color printed material easily. As such, it is widely used not only in offices but also by general users along with popularization of a personal computer and a digital camera.

Generally, in such an ink jet printer, a moving part called a carriage, for example, integrally comprising ink cartridges and print heads moves back and forth on a print medium in a direction crossing a direction to convey the medium and nozzles of the print head jet (eject) liquid ink drops to form minute ink dots on the print medium. In this manner, pre-determined characters or images are drawn on the print medium to create desired printed material. The carriage comprises ink cartridges for four colors including black (and yellow, magenta, cyan) and a print head for each of the colors, so that not only monochrome print but also full color print in combination of the respective colors can be easily performed (further, print in six colors including the colors, light cyan and light magenta, seven colors, and eight colors are practically implemented).

The above type of ink jet printer for executing print by moving the ink jet heads on the carriage back and forth in a direction crossing a direction to convey a print medium in the above manner, the ink jet heads must be moved back and forth for about ten times or for more than tens of times to neatly print a whole page. Therefore, it has a drawback in that it takes a longer time for printing than a print apparatus in another scheme, for example, a laser printer or a copying machine using electrographic technique.

On the other hand, in an ink jet printer comprising ink jet heads (do not need to be integrated) of the same length as the width of a print medium but not comprising a carriage, the ink jet heads do not need to be moved in a width direction of the print medium so that one-pass printing is possible, enabling quick printing similar to a laser printer. An ink jet printer in the former scheme is generally called a "multi-pass (serial) ink jet printer", while an ink jet printer in the latter scheme is generally called a "line head ink jet printer".

The above types of ink jet printers are required to provide further higher gradation. Gradation is the density of each color included in a pixel represented by an ink dot: the size of an ink dot depending on the density of a color of each pixel is called gradient, while the number of gradients represented by an ink dot is called the number of gradations. High gradation means that the number of gradations is large. To change gradient, it is necessary to change a drive pulse to an actuator provided for an ink jet head. For example, if an actuator is a piezoelectric element, when a voltage value applied to the piezoelectric element is large, the magnitude of displacement (distortion) of the piezoelectric element (precisely, a vibrating plate) is also large. This is used to change the gradient of an ink dot.

According to JP-A-10-81013, a plurality of drive pulses having different voltage peak values are combined and coupled to generate a drive signal. The signal is outputted to piezoelectric elements of nozzles for the same color provided for an ink jet head. According to the drive signal, a drive pulse for the gradient of an ink dot to be formed is selected for each nozzle. The selected drive pulse is supplied to a piezoelectric element of an appropriate nozzle to jet an ink drop. In this manner, a requested gradient of an ink dot is achieved.

A method of generating a drive signal (or drive pulse) is illustrated in FIG. 2 of JP-A-2004-306434. That is, data is read out from a memory for storing drive signal data, a D/A converter converts the data into analog data, and a drive signal is supplied to an ink jet head through a current amplifier. A circuit of the current amplifier comprises the transistors in push-pull connection, as shown in FIG. 3 of the document, in which a linear drive amplifies a drive signal. However, in a current amplifier with such configuration, a linear drive itself of a transistor is inefficient. Moreover, such an amplifier has a drawback of a large circuit size since the transistor itself should be large for a countermeasure against heat, or the transistor needs a cooling plate radiator. Particularly, the largeness of the cooling plate radiator is a major obstacle to the layout.

To resolve the drawback, JP-A-2005-35062 discloses an ink jet printer for generating a drive signal by controlling the reference voltage of a DC/DC converter. According to the document, an efficient DC/DC converter is used to dispense with a radiating unit for cooling. Additionally, a PWM signal is used so that a D/A converter can be realized using a simple low-pass filter. These can realize a small circuit.

However, a DC/DC converter is originally designed to generate a constant voltage. As such, the head drive apparatus of an ink jet printer using the DC/DC converter in JP-A-2005-35062 has a problem in that a waveform, for example, rapid rise and fall of a drive signal cannot be gained necessary for an ink jet head to jet ink drops well. Of course, the head drive apparatus of an ink jet printer in which a pair of transistors in push-pull connection amplifies current of an actuator drive signal in JP-A-2004-306434 has a problem in that a cooling plate radiator is so large that it cannot be actually laid out particularly in a line head ink jet printer having a large number of nozzles, i.e., a large number of actuators.

SUMMARY

An object of the present invention is to provide a head drive apparatus of an ink jet printer that enables rapid rise and fall of a drive signal to an actuator, does not require a cooling unit such as a cooling plate radiator, and can inhibit or prevent distortion of a drive signal or power loss.

[First Aspect] To solve the above problems, a head drive apparatus of an ink jet printer according to a first aspect characterized by including: a plurality of nozzles for jetting liquid drops that are provided for an ink jet head; actuators provided in correspondence to the nozzles; and a drive unit that applies a drive signal to the actuators, wherein the drive unit comprises: a drive waveform generator that generates a drive waveform signal being standard of a signal to control drive of the actuators; a modulator that modulates a pulse of a drive waveform signal generated by the drive waveform generator; a digital power amplifier for amplifying power of a modulated signal subjected to the pulse modulation by the modulator; and a low pass filter for smoothing a amplified digital signal subjected to the power amplification by the digital power amplifier and supplying the signal as a drive signal to the actuators.

In the head drive apparatus of an ink jet printer according to the first aspect, the drive waveform generator generates a drive waveform signal being standard of a signal to control drive of the actuators, the modulator modulates a pulse of the generated drive waveform signal, the digital power amplifier amplifies the power of the modulated signal subjected to the pulse modulation, the low pass filter smoothes the amplified digital signal subjected to the power amplification and supplies the signal as a drive signal to the actuator. Thus, filter characteristics of the low pass filter are set to sufficiently smooth only a amplified digital signal component so that rapid rise and fall of a drive signal to the actuators are enabled and the digital power amplifier with efficient power amplification can efficiently amplify the power of a drive signal. This dispenses with a cooling unit such as a cooling plate radiator.

[Second Aspect] A head drive apparatus of an ink jet printer according to a second aspect characterized by including: a plurality of nozzles for jetting liquid drops that are provided for an ink jet head; actuators provided in correspondence to the nozzles; and a drive unit that applies a drive signal to the actuators, wherein the drive unit comprises: a drive waveform generator that generates a drive waveform signal being standard of a signal to control drive of the actuators; a modulator that modulates a pulse of a drive waveform signal generated by the drive waveform generator; a digital power amplifier for amplifying power of a modulated signal subjected to the pulse modulation by the modulator; and a low pass filter for smoothing a amplified digital signal subjected to the power amplification by the digital power amplifier and supplying the signal as a drive signal to the actuators, and the modulator comprises a pulse modulation method changing unit that changes a pulse modulation method depending on an input signal level of a drive waveform signal.

The pulse modulation method includes well known triangular wave comparison pulse width modulation to compare an analog signal and a standard triangular wave and decide Hi/Lo. The triangular wave comparison pulse width modulation can gain a modulated signal with a pulse duty in proportion to an input signal. However, simultaneous and opposite ON/OFF control of two switching transistors of a digital power amplifier by using a modulated signal produced by the triangular wave comparison pulse width modulation causes large power loss. However, if ON/OFF control of the switching transistors at different times, a amplified digital signal is not generated in a low ON-duty area (=high OFF-duty) or a low OFF-duty (=high ON-duty) area, causing distortion of a drive signal. Meanwhile, self-oscillating pulse width modulation has an advantage in that a amplified digital signal can be generated in a low ON-duty area or a low OFF-duty area. However, there is a trade-off that when the duty ratio is closer to 50%, the pulse frequency is higher and switching loss increases.

In the head drive apparatus of an ink jet printer according to the second aspect, the drive waveform generator generates a drive waveform signal being standard of a signal to control drive of the actuators, the modulator modulates a pulse of the generated drive waveform signal, the digital power amplifier amplifies the power of the modulated signal subjected to the pulse modulation, the low pass filter smoothes the amplified digital signal subjected to the power amplification and supplies the signal as a drive signal to the actuator. Thus, filter characteristics of the low pass filter are set to sufficiently smooth only a high frequency component of a amplified digital signal so that a correct drive signal can be generated to the actuators and the digital power amplifier with efficient power amplification can efficiently amplify the power of a drive signal. This dispenses with a cooling unit such as a cooling plate radiator.

A pulse modulation method can be changed depending on an input signal level of a drive waveform signal. Thus, a self-oscillating pulse width modulation method is used in a low ON-duty (=high OFF-duty) area, that is an area with a low input signal level of a drive waveform signal, and a low OFF-duty (=high ON-duty) area, that is an area with a high input signal level of a drive waveform signal. In the other areas, a triangular wave comparison pulse width modulation method is used. This can inhibit or prevent distortion of a drive signal and power loss.

[Third Aspect] A head drive apparatus of an ink jet printer according to a third aspect is characterized in that in the head drive apparatus of an ink jet printer according to the second aspect, the pulse modulation method changing unit uses the triangular wave comparison pulse width modulation method for pulse modulation if the input signal level of the drive waveform signal is in a preset range, and uses the self-oscillating pulse width modulation method for pulse modulation if the input signal level of the drive waveform signal is lower than the preset range.

In the head drive apparatus of an ink jet printer according to the third aspect, if an input signal level of a drive waveform signal is in a preset range, the triangular wave comparison pulse width modulation method is used for pulse modulation, and if an input signal level of a drive waveform signal is lower than the preset range, the self-oscillating pulse width modulation method is used for pulse modulation. This can effectively inhibit or prevent distortion of a drive signal or power loss.

[Fourth Aspect] A head drive apparatus of an ink jet printer according to a fourth aspect is characterized in that in the head drive apparatus of an ink jet printer according to the second or third aspect, the pulse modulation method changing unit uses the triangular wave comparison pulse width modulation method for pulse modulation if the input signal level of the drive waveform signal is in a preset range, and uses the self-oscillating pulse width modulation method for pulse modulation if the input signal level of the drive waveform signal is higher than the preset range.

In the head drive apparatus of an ink jet printer according to the fourth aspect, if an input signal level of a drive waveform signal is in a preset range, the triangular wave comparison pulse width modulation method is used for pulse modulation, and if an input signal level of a drive waveform signal is higher than the preset range, the self-oscillating pulse width modulation method is used for pulse modulation. This can effectively inhibit or prevent distortion of a drive signal or power loss.

[Fifth Aspect] A head drive control method for an ink jet printer according to a fifth aspect is characterized by controlling drive of the actuator by: generating a drive waveform signal being standard of a signal to control drive of actuators provided in correspondence to a plurality of nozzles for jetting liquid drops provided for the ink jet head; modulating a pulse of the drive waveform signal generated; amplifying power of a modulated signal subjected to the pulse modulation by a digital power amplifier; and smoothing a amplified digital signal subjected to the power amplification by the digital power amplifier and supplying the signal as a drive signal to the actuator.

With the head drive control method for an ink jet printer according to the fifth aspect, rapid rise and fall of a drive signal to the actuators are enabled and the power of a drive signal can be efficiently amplified so that it is no longer necessary to cool a cooling plate radiator and the like, similarly to the first aspect.

[Sixth Aspect] A head drive control method for an ink jet printer according to a sixth aspect is characterized in that a pulse is modulated by using the triangular wave comparison pulse width modulation method for pulse modulation if the input signal level of the drive waveform signal is in a preset range, and a pulse is modulated by using the self-oscillating pulse width modulation method if the input signal level of the drive waveform signal is lower or higher than the preset range.

With the head drive control method for an ink jet printer according to the sixth aspect, distortion of a drive signal or power loss can be effectively inhibited or prevented similarly the second to fourth aspects.

[Seventh Aspect] An ink jet printer according to a seventh aspect comprises the head drive apparatus according to the second aspect.

DESCRIPTION OF SYMBOLS

1: print medium; 2: first ink jet head; 3: second ink jet head; 4: first conveyor unit; 5: second conveyor unit; 6: first conveyor belt; 7: second conveyor belt; 8R, 8L: drive rollers; 9R, 9L: first driven rollers; 10R, 10L: second driven rollers; 11R, 11L: electric motors; 24: modulator; 25: digital power amplifier; 26: low pass filter; 31: comparator; 32: triangular wave oscillator; 33: half bridge driver stage; 34: gate drive circuit; 51: memory controller; 52: memory unit; 53: numerical value generator; 54: comparing unit; 70: drive waveform generator

DESCRIPTION OF EXEMPLARY EMBODIMENTS

A first embodiment of an ink jet printer according to the present invention will be described with reference to the drawings.

Figure 1A:
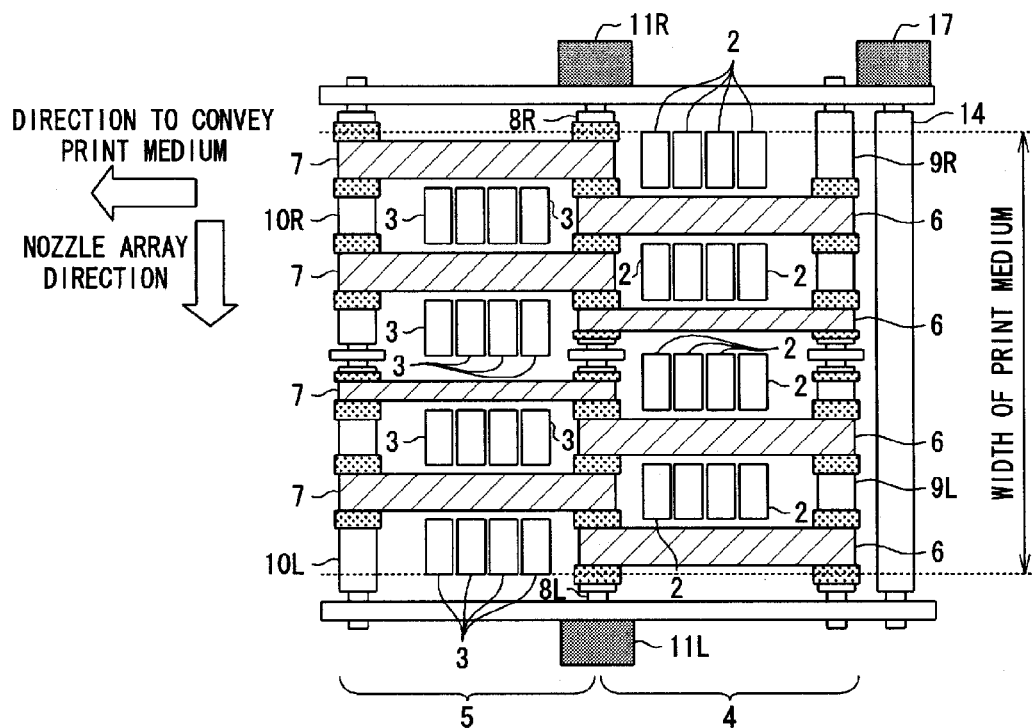
FIGS. 1A and 1B are the overall configuration diagrams showing a first embodiment of a line head ink jet printer to which a head drive apparatus of the ink jet printer according to the present invention is applied: (a) is a top plain view and (b) is a front view.
Figure 1B:
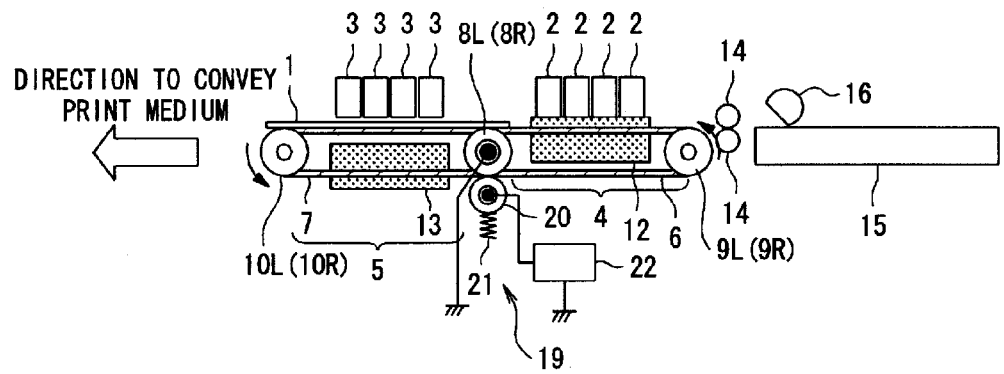

FIGS. 1A and 1B are the overall configuration diagrams of the ink jet printer according to this embodiment: FIG. 1A is a top plain view of the printer; and FIG. 1B is a front view of the printer. In FIGS. 1A and 1B, a print medium 1 is a line head ink jet printer that is conveyed from the right to the left in the figure in a direction indicated by an arrow in the figure and printed in a printing area on the way of the conveyor. However, ink jet heads according to this embodiment are arranged not only on one place, but also two places.

Reference numeral 2 in the figure denotes first ink jet heads being provided in the upstream side in the direction to convey the print medium 1. Reference numeral 3 denotes second ink jet heads being provided in the downstream side. A first conveyor unit 4 is provided below the first ink jet heads 2 for conveying the print medium 1, while a second conveyor unit 5 is provided below the second ink jet heads 3. The first conveyor unit 4 comprises four first conveyor belts 6 being spaced apart in a direction crossing the direction to convey the print medium 1 (hereinafter, also referred to as a nozzle array direction). The second conveyor unit 5 similarly comprises four second conveyor belts 7 being spaced apart in the direction (nozzle array direction) crossing the direction to convey the print medium 1.

The four second conveyor belts 7 and the four first conveyor belts 6 are provided alternately. This embodiment divides the conveyor belts into two of the first conveyor belts 6 and two of the second conveyor belts 7 at the left side in the nozzle array direction and two of the first conveyor belts 6 and two of the second conveyor belts 7 at the right side in the nozzle array direction. That is, a right drive roller 8R is provided in an overlapping part of the two first conveyor belts 6 and the two second conveyor belts 7 at the right side in the nozzle array direction. A left drive roller 8L is provided in an overlapping part of the two first conveyor belts 6 and the two second conveyor belts 7 at the left side in the nozzle array direction. A first right driven roller 9R and a first left driven roller 9L are provided at the upstream side, while a second right driven roller 10R and a second left driven roller 10L are provided at the downstream side. The rollers are actually separated at the center part of FIG. 1A, though they are viewed as a series of rollers. The two first conveyor belts 6 at the right side in the nozzle array direction are wound around the right drive roller 8R and the first right driven roller 9R. The two first conveyor belts 6 at the left side in the nozzle array direction are wound around the left drive roller 8L and the first left driven roller 9L. The two second conveyor belts 7 at the right side in the nozzle array direction are wound around the right drive roller 8R and the second right driven roller 10R. The two second conveyor belts 7 at the left side in the nozzle array direction are wound around the left drive roller 8L and the second left driven roller 10L. The right drive roller 8R connects to the right electric motor 11R, while the left drive roller 8L connects to the left electric motor 11L. As such, when the right electric motor 11R rotates the right drive roller 8R, the first conveyor unit 4 comprising the two first conveyor belts 6 at the right side in the nozzle array direction and the second conveyor unit 5 similarly comprising the two second conveyor belts 7 at the right side in the nozzle array direction synchronize with each other and move at the same speed. When the left electric motor 11L rotates the left drive roller 8L, the first conveyor unit 4 comprising the two first conveyor belts 6 at the left side in the nozzle array direction and the second conveyor unit 5 similarly comprising the two second conveyor belts 7 at the left side in the nozzle array direction synchronize with each other and move at the same speed. However, if the right electric motor 11R and the left electric motor 11L rotate at different speeds, conveyor speeds of left and right sides in the nozzle array direction can be changed. Specifically, if the rotation speed of the right electric motor 11R is higher than the rotation speed of the left electric motor 11L, the conveyor speed of the right side in the nozzle array direction can be higher than that of the left side. If the rotation speed of the left electric motor 11L is higher than the rotation speed of the right electric motor 11R, the conveyor speed of the left side in the nozzle array direction can be higher than that of the right side.

The first ink jet heads 2 and the second ink jet heads 3 are provided to be shifted in the direction to convey the print medium 1 for each of four colors of yellow (Y), magenta (M), cyan (C) and black (K). To the respective ink jet heads 2 and 3, ink is supplied from ink tanks (not shown) for the respective colors via ink supply tubes. Each of the ink jet heads 2 and 3 has a plurality of nozzles formed in the direction crossing the direction to convey the print medium 1 (i.e., the nozzle array direction). The nozzles simultaneously jet a necessary amount of ink drops to a necessary position to form and output minute ink dots on the print medium 1. This is performed for each color so that one-pass printing can be performed by causing the print medium 1 conveyed by the first conveyor unit 4 and the second conveyor unit 5 to pass through the heads only once. That is, the areas where the ink jet heads 2 and 3 are arranged correspond to printing areas.

A method of jetting and outputting ink from each nozzle of an ink jet head includes an electrostatic scheme, a piezoelectric inkjet, a film-boiling ink jet and the like. In the electrostatic scheme, a drive signal given to an electrostatic gap being an actuator causes a displacement of a vibrating plate in a cavity and a change of pressure in the cavity, in which the change of pressure causes jet and output of ink drops from a nozzle. In the piezoelectric inkjet, a drive signal given to a piezoelectric element being an actuator causes a displacement of a vibrating plate in a cavity and a change of pressure in the cavity, in which the change of pressure causes jet and output of ink drops from a nozzle. In the film-boiling ink jet, a microheater in a cavity is instantaneously heated to 300° C. or more to make ink in the film-boiling state and generate bubbles, in which a change of pressure causes jet and output of ink drops from a nozzle. Any of the inkjet methods can be applied to the present invention. Among them, the present invention is particularly preferable to a piezoelectric element since the amount of ink drop jet can be modified by modifying the peak value or a degree of voltage increase and decrease of a drive signal.

The ink drop jetting nozzles of the first ink jet heads 2 are formed only between the four first conveyor belts 6 of the first conveyor unit 4, while the ink drop jetting nozzles of the second ink jet heads 3 are formed only between the four second conveyor belts 7 of the second conveyor unit 5. This is because a cleaning unit described later cleans the respective ink jet heads 2 and 3. However, one-pass full-page printing cannot be accomplished only by either of the ink jet heads. Accordingly, the first ink jet heads 2 and the second ink jet heads 3 are provided to be shifted from each other in the direction to convey the print medium 1 to cover parts that either of them cannot print.

A first cleaning cap 12 for cleaning the first ink jet heads 2 is provided under the first ink jet heads 2. A second cleaning cap 13 for cleaning the second ink jet heads 3 is provided under the second ink jet heads 3. The cleaning caps 12 and 13 are the size to pass between the four first conveyor belts 6 of the first conveyor unit 4 and between the four second conveyor belts 7 of the second conveyor unit 5, respectively. The cleaning caps 12 or 13 comprises: a square cap body with a bottom that covers the nozzles formed on the bottom surface of the ink jet heads 2 or 3, i.e., the nozzle side and can be adhered to the nozzle side; an ink absorber provided on the bottom; a tube pump connected to the bottom of the cap body; and an elevator for moving up and down the cap body. As such, the elevator moves up the cap body to adhere the body to the nozzle side of the ink jet heads 2 or 3. When the tube pump makes the cap body under negative pressure in that state, ink drops and bubbles are siphoned off the nozzles being set up on the nozzle side of the ink jet heads 2 or 3 to clean the ink jet heads 2 or 3. When the cleaning finishes, the cleaning caps 12 and 13 are moved down.

A pair of gate rollers 14 is provided for modifying timing to feed paper the print medium 1 supplied from a paper feeder 15 and for correcting the skew of the print medium 1, at the upstream side of the first driven rollers 9R and 9L. The skew is the torsion of the print medium 1 to the conveyor direction. A pickup roller 16 for supplying the print medium 1 is provided above the paper feeder 15. Reference numeral 17 in the figure denotes a gate roller motor for driving the gate rollers 14.

A belt charging unit 19 is provided below the drive rollers 8R and 8L. The belt charging unit 19 comprises: a charging roller 20 contacting the first conveyor belts 6 and the second conveyor belts 7 across the drive rollers 8R and 8L; a spring 21 for pressing the charging roller 20 against the first conveyor belts 6 and the second conveyor belts 7; and a power source 18 for imparting electric charge to the charging roller 20. The belt charging unit 19 imparts electric charge to the first conveyor belts 6 and the second conveyor belts 7 from the charging roller 20 to charge the belts. Generally, when such a type of belt, which includes a medium or high resistor or insulator, are charged by the belt charging unit 19, electric charge applied on the surface causes induced polarization to the print medium 1 similarly including a high resistor or insulator. The print medium 1 can be adsorbed to the belt by electrostatic force that occurs between electric charge generated by the induced polarization and electric charge of the belt surface. A charging unit can be a corotron causing electric charge to flood.

In the ink jet printer, the belt charging unit 19 charges the surfaces of the first conveyor belts 6 and the second conveyor belts 7. In that state, the gate rollers 14 feed the print medium 1, and a paper pressing roller comprising a spur (not shown) and a roller presses the print medium 1 against the first conveyor belts 6. Then, the operation of the induced polarization described above causes the print medium 1 to be adsorbed to the surface of the first conveyor belts 6. In that state, when the electric motors 11R and 11L rotate the drive rollers 8R and 8L, respectively, the rotary drive force is transmitted to the first driven rollers 9R and 9L via the first conveyor belts 6.

In the state in that the print medium 1 is adsorbed in the above manner, the first conveyor belts 6 are moved downstream in the conveyor direction, the print medium 1 is moved under the first ink jet heads 2, and the nozzles formed on the first ink jet heads 2 jet ink drops for printing. When the printing by the first ink jet heads 2 finishes, the print medium 1 is moved downstream in the conveyor direction toward the second conveyor belts 7 of the second conveyor unit 5. As described above, the surfaces of the second conveyor belts 7 are also charged by the belt charging unit 19, so that the operation of the induced polarization described above causes the print medium 1 to be adsorbed to the surfaces of the second conveyor belts 7.

In the above state, the second conveyor belts 7 are moved downstream in the conveyor direction, the print medium 1 is moved under the second ink jet heads 3, and the nozzles formed on the second ink jet heads jet ink drops for printing. When the printing by the second ink jet heads finishes, the print medium 1 is further moved downstream in the conveyor direction, a separation unit (not shown) separates the print medium 1 from the surfaces of the second conveyor belts 7 to eject paper toward a paper ejector.

If the first and second ink jet heads 2 and 3 need to be cleaned, as described above, the first and second cleaning caps 12 and 13 are moved upward to adhere the cap body to the nozzle side of the first and second ink jet heads 2 and 3. In that state, the cap body made to be under negative pressure to perform cleaning by siphoning off ink drops and bubbles from the nozzles of the first and second ink jet heads 2 and 3. After the cleaning, the first and second cleaning caps 12 and 13 are moved downward.

Figure 2:
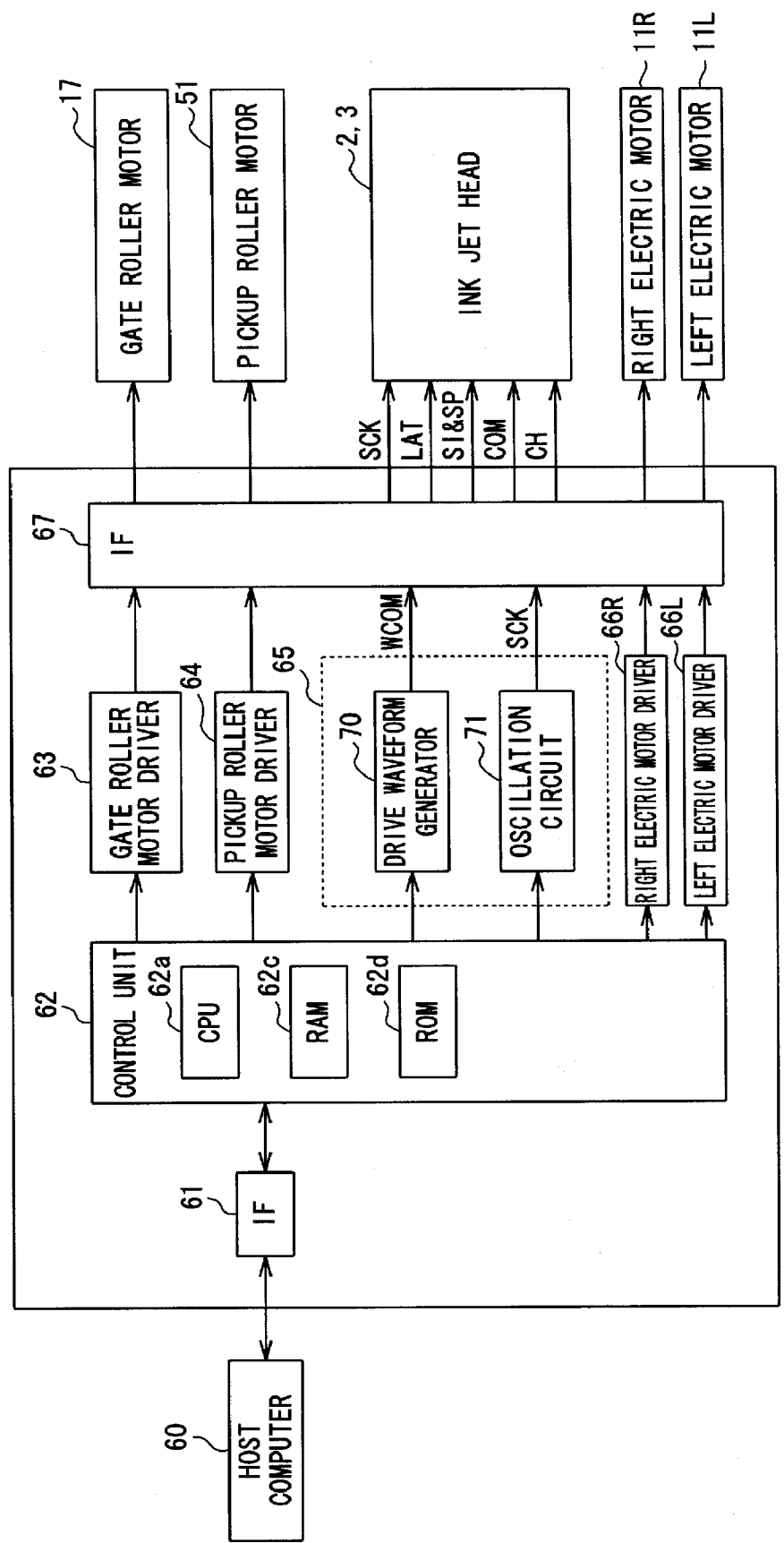
FIG. 2 is a block diagram of a control apparatus of the ink jet printer in FIGS. 1A and 1B.

The ink jet printer includes a control apparatus for controlling the printer itself. The control apparatus processes printing on a print medium by controlling a print unit or a paper feed unit based on print data inputted from a host computer 60 such as a personal computer or a digital camera, as shown in FIG. 2. The control apparatus comprises: an input interface 61 for receiving print data inputted from the host computer 60; a control unit 62 comprising a micro computer for executing print processing based on the print data inputted from the input interface 61; a gate roller motor driver 63 for controlling drive of the gate roller motor 17; a pickup roller motor driver 64 for controlling drive of a pickup roller motor 51 for driving the pickup roller 16; a head driver 65 for controlling drive of the ink jet heads 2 and 3; a right electric motor driver 66R for controlling drive of the right electric motor 11R; a left electric motor driver 66L for controlling drive of the left electric motor 11L; and an interface 67 for converting an output signal from each of the drivers 63 to 65, 66R and 66L into a control signal used by the external gate roller motor 17, the pickup roller motor 51, the ink jet heads 2 and 3, the right electric motor 11R and the left electric motor 11L and outputting the signal.

The control unit 62 comprises: a CPU (Central Processing Unit) 62a for executing various processing such as print processing; a RAM (Random Access Memory) 62c for temporally storing print data inputted via the input interface 61 or various data to execute processing to print the print data, or for temporally deploying an application program such as for print processing; and a ROM (Read-Only Memory) 62d comprising a non-volatile semiconductor memory for storing a control program executed by the CPU 62a. When the control unit 62 gets print data (image data) from the host computer 60 via the interface 61, the CPU 62a executes pre-determined processing on the print data, outputs print data (drive pulse selection data SI&SP) including which nozzle jets ink drops or how many ink drops are jetted, and outputs a control signal to each of the drivers 63 to 65, 66R and 66L based on the print data and input data from various sensors. When each of the drivers 63 to 65, 66R and 66L outputs the control signal, the interface 67 converts the signal into a drive signal, an actuator corresponding to a plurality of nozzles of an ink jet head, the gate roller motor 17, the pickup roller motor 51, the right electric motor 11R and the left electric motor 11L are actuated to execute paper feed and conveyor of the print medium 1, posture control of the print medium 1, and print processing on the print medium 1. The respective components of the control unit 62 are electrically connected to one another via a bus (not shown).

To write waveform forming data DATA to form a drive signal described later into a waveform memory 701 described later, the control unit 62 also outputs a write enable signal DEN, a write clock signal WCLK, and write address data A0 to A3 and writes the 16-bit waveform forming data DATA into the waveform memory 701. Further, the unit 62 outputs the following to the head driver 65: read address data A0 to A3 to read out the waveform forming data DATA stored in the waveform memory 701, a first clock signal ACLK to set timing to latch the waveform forming data DATA being read out from the waveform memory 701, a second clock signal BCLK to set timing to add the latched waveform data, and a clear signal CLER to clear the latch data.

Figure 3:
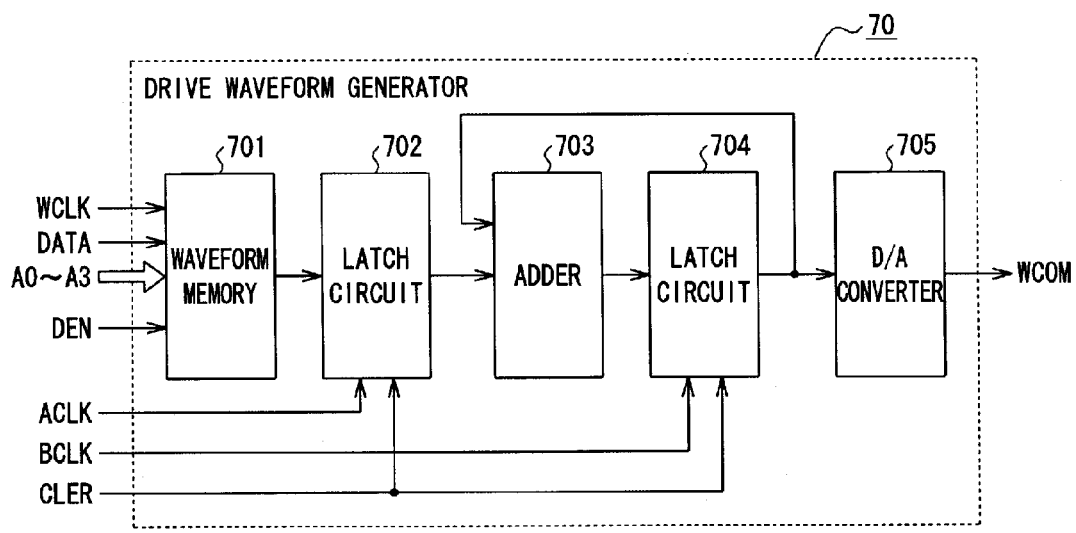
FIG. 3 is a block diagram of a drive waveform generator in FIG. 2.

The head driver 65 comprises a drive waveform generator 70 for forming a drive waveform signal WCOM and an oscillation circuit 71 for outputting a clock signal SCK. The drive waveform generator 70 comprises: the waveform memory 701 for storing waveform forming data DATA to generate a drive waveform signal inputted from the control unit 62 in a storage element corresponding to a pre-determined address; a latch circuit 702 for latching the waveform forming data DATA read out from the waveform memory 701 with the first clock signal ACLK described above; an adder 703 for adding output of the latch circuit 702 and the waveform generation data WDATA outputted from a latch circuit 704 described later; the latch circuit 704 for latching addition output of the adder 703 with the second clock signal BCLK described above; and a D/A converter 705 for converting the waveform generation data WDATA outputted from the latch circuit 704 into an analog signal, as shown in FIG. 3. A clear signal CLER outputted from the control unit 62 is inputted to the latch circuits 702 and 704. When the clear signal CLER is in the off state, latch data is cleared.

Figure 4:
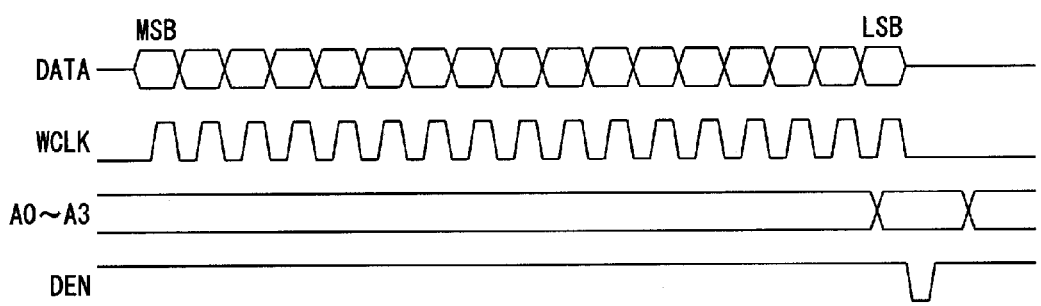
FIG. 4 is a diagram illustrating a waveform memory in FIG. 3.

The waveform memory 701 includes several bit memory elements being arranged at each designated address stores addresses A0 to A3 and the waveform data DATA, as shown in FIG. 4. Specifically, the clock signal WCLK and the waveform data DATA are inputted to the addresses A0 to A3 designated by the control unit 62, and input of write enable signal DEN causes the waveform data DATA to be stored in the memory elements.

Next, principles of drive waveform signal generation by the drive waveform generator 70 will be described. First, waveform data of which amount of voltage change is 0 during a unit of time is written at the address A0 described above. Similarly, waveform data $+\Delta V1$ is written at the address A1, waveform data $-\Delta V2$ is written at the address A2, and waveform data $+\Delta V3$ is written at the address A3. The clear signal CLER clears data saved by the latch circuits 702 and 704. The drive waveform signal WCOM rises to the midpoint potential (offset) according to the waveform data.

Figure 5:
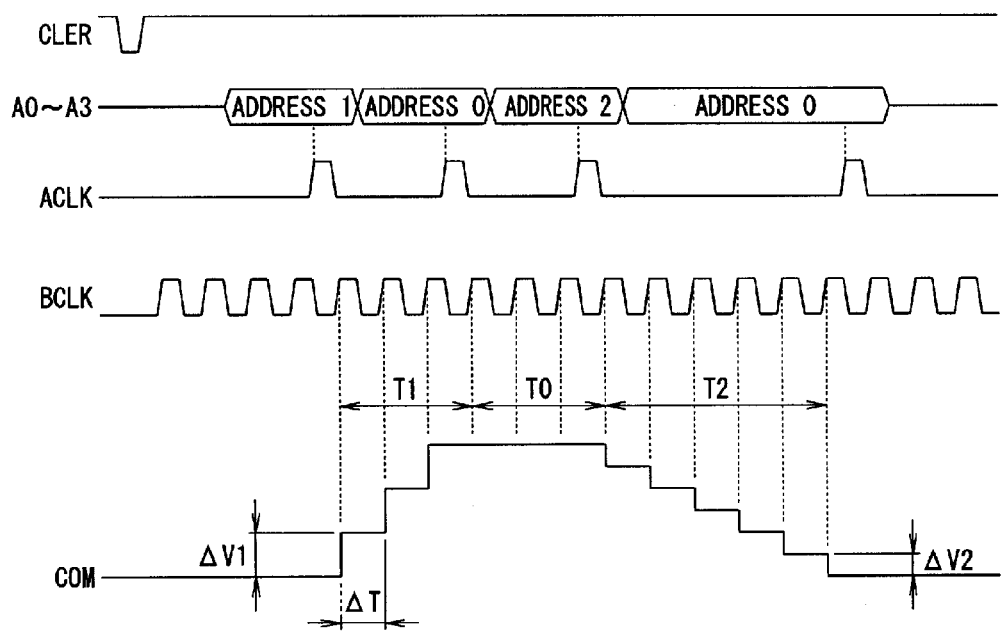
FIG. 5 is a diagram illustrating drive waveform signal generation.

In the above state, when the waveform data at the address A1 is read and the first clock signal ACLK is inputted, the digital data $+\Delta V1$ is saved in the latch circuit 702, as shown in FIG. 5. The saved digital data $+\Delta V1$ is inputted to the latch circuit 704 via the adder 703. The latch circuit 704 saves output of the adder 703 in synchronization with a rise of the second clock signal BCLK. The output of the latch circuit 704 is also inputted to the adder 703. Accordingly, the output of the latch circuit 704, i.e., the drive signal COM is incremented by $+\Delta V1$ whenever the second clock signal BCLK rises. In this example, the waveform data at the address A1 is read in duration T1. As a result, the signal COM is incremented until the digital data $+\Delta V1$ is the triple.

Then, when the waveform data address A0 is read and the first clock signal ACLK is inputted, digital data saved in the latch circuit 702 switches to 0. The digital data being 0 goes through the adder 703 to be incremented whenever the second clock signal BCLK rises, similarly to the above description. However, since the digital data is 0, a previous value is actually retained. In this example, the drive signal COM is retained at a certain value in duration T0.

Then, when the waveform data address A2 is read and the first clock signal ACLK is inputted, digital data saved in the latch circuit 702 switches to $-\Delta V2$. The digital data being $-\Delta V2$ goes through the adder 703 to be incremented whenever the second clock signal BCLK rises, similarly to the above description. However, since the digital data is $-\Delta V2$, the drive signal COM is actually decremented by $-\Delta V2$ according to the second clock signal. In this example, the signal COM is decremented in a duration T2 until the digital data $-\Delta V2$ is sixfold.

Figure 6:
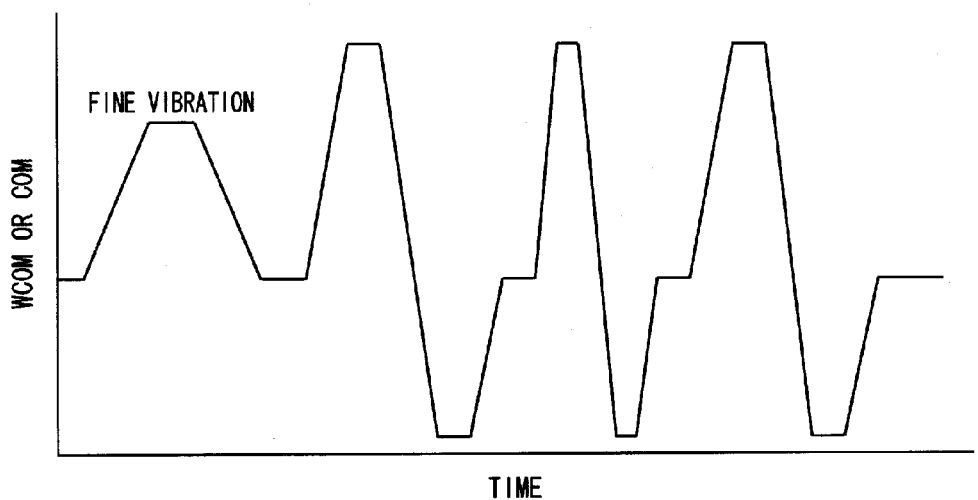
FIG. 6 is a diagram illustrating a drive waveform signal or a drive signal joined time-sequentially.
Figure 7:
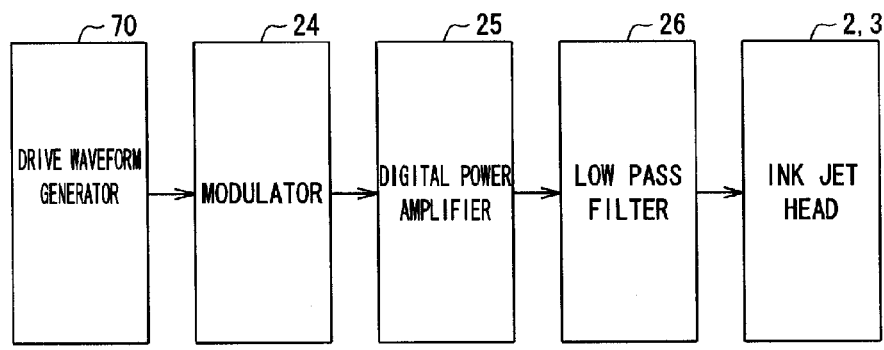
FIG. 7 is a block diagram of a drive signal output circuit.

When the D/A converter 705 converts the digital signal generated in the above manner into an analog signal, a drive waveform signal WCOM as shown in FIG. 6 is gained. A drive signal output circuit shown in FIG. 7 amplifies the power of the analog signal and supplies the signal as a drive signal COM to the ink jet heads 2 and 3. In this way, actuators such as piezoelectric elements provided for the respective nozzles can be driven, so that the nozzles can jet ink drops. The drive signal output circuit comprises: a modulator 24 for modulating a pulse of a drive waveform signal WCOM generated by the drive waveform generator 70; a digital power amplifier 25 for amplifying power of the modulated (PWM) signal subjected to the pulse modulation by the modulator 24; and a low pass filter 26 for smoothing the modulated (PWM) signal subjected to the power amplification by the digital power amplifier 25.

A time of a rise of the drive signal COM is a stage to increase the volume of a cavity (pressure chamber) communicating with a nozzle and to pull in ink (pull in meniscus, from the viewpoint of the ink-jetted surface). A time of a fall of the drive signal COM is a stage to decrease the volume of the cavity and to push out ink (push out meniscus, from the viewpoint of the ink-jetted surface). As a result of the pushing-out of ink, the nozzle jets ink drops. A waveform of the drive signal COM or the drive waveform signal WCOM can be modified with waveform data 0, $+\Delta V1$, $-\Delta V2$, $+\Delta V3$, the first clock signal ACLK and the second clock signal BCLK written at the addresses A0 to A3, as easily inferred from the above description.

A voltage increase and decrease degree and the peak value of the drive signal COM in a voltage trapezoid wave are variously changed so that the amount of pulled in ink, the pull-in speed, the amount of pushed out ink and the push-out speed can be changed. This can change the amount of jet of ink drops to gain different sizes of ink dots. Thus, even if a plurality of drive signals COM are coupled time-sequentially as shown in FIG. 6, a single drive signal COM is selected from the signals to be supplied to a piezoelectric actuator 22 for jet of ink drops; or a plurality of drive signals COM are selected to be supplied to the piezoelectric actuator 22 for jet of ink drops for times, thereby gaining various sizes of ink dots. That is, if a plurality of ink drops are dripped at the same position while ink is wet, actually a large ink drop is jetted, so that the size of an ink dot can be large. The combination of such techniques can accomplish the multiple tones. A drive pulse at the far left in FIG. 6 only pulls in ink but does not pull out ink. This is called fine vibration, which is used to inhibit or prevent a nozzle from being dried without jetting ink drops.

As a result, the following are inputted to the ink jet heads 2 and 3: the drive signal COM generated by the drive signal output circuit; a drive pulse selection data SI&SP to select a nozzle for jet based on print data and to decide time of connection to the drive signal COM of an actuator such as a piezoelectric element; a latch signal LAT and a channel signal CH to connect the drive signal COM and the actuators of the ink jet heads 2 and 3 based on the drive pulse selection data SI&SP after nozzle selection data is inputted to all nozzles; and a clock signal SCK to transmit the drive pulse selection data SI&SP as a serial signal to the ink jet heads 2 and 3.

Figure 8:
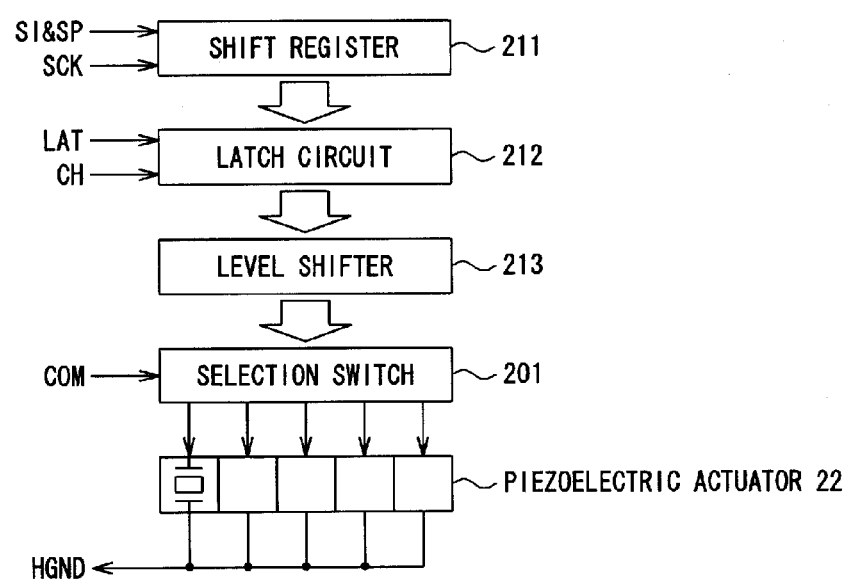
FIG. 8 is a block diagram of a selector for connecting a drive signal to an actuator.

Next, a mechanism to connect the drive signal COM outputted from the drive signal output circuit to the actuator such as a piezoelectric element will be described. FIG. 8 is a block diagram of a selector for connecting the drive signal COM to the actuator such as a piezoelectric element. The selector comprises: a shift register 211 for saving drive pulse selection data SI&SP to designate an actuator such as a piezoelectric element corresponding to a nozzle for jetting ink drops; a latch circuit 212 for temporally saving data of the shift register 211; a level shifter 213 for converting a level of output of the latch circuit 212; and a selection switch 201 for connecting a drive signal COM to an actuator such as a piezoelectric element depending on output of the level shifter.

As drive pulse selection data SI&SP are serially inputted to the shift register 211, a storage area of the register serially shifts from the first part to latter parts depending on an inputted pulse of a clock signal SCK. After drive pulse selection data SI&SP for the number of nozzles is stored in the shift register 211, the latch circuit 212 latches each output signal of the shift register 211 according to an inputted latch signal LAT. The level of a signal saved in the latch circuit 212 is converted into a voltage level to turn on/off the selection switch 201 in the next part by the level shifter 213. This is because voltage of the drive signal COM is higher than output voltage of the latch circuit 212, and a range of the operating voltage of the selection switch 201 is also set to a high range accordingly. Thus, the actuator such as a piezoelectric element of which selection switch 201 is closed by the level shifter 213 is connected to the drive signal COM at a time for connection of the drive pulse selection data SI&SP. After a drive pulse selection data SI&SP of the shift register 211 is saved in the latch circuit 212, the next print information is inputted to the shift register 211, and data saved in the latch circuit 212 is serially updated each time ink drops are jetted.

Reference character HGND in the figure denotes a ground terminal of the actuator such as a piezoelectric element. The selection switch 201 also maintains input voltage of the actuator 22 at voltage immediately before separation even after the actuator such as a piezoelectric element is separated from a drive signal COM.

Figure 9:
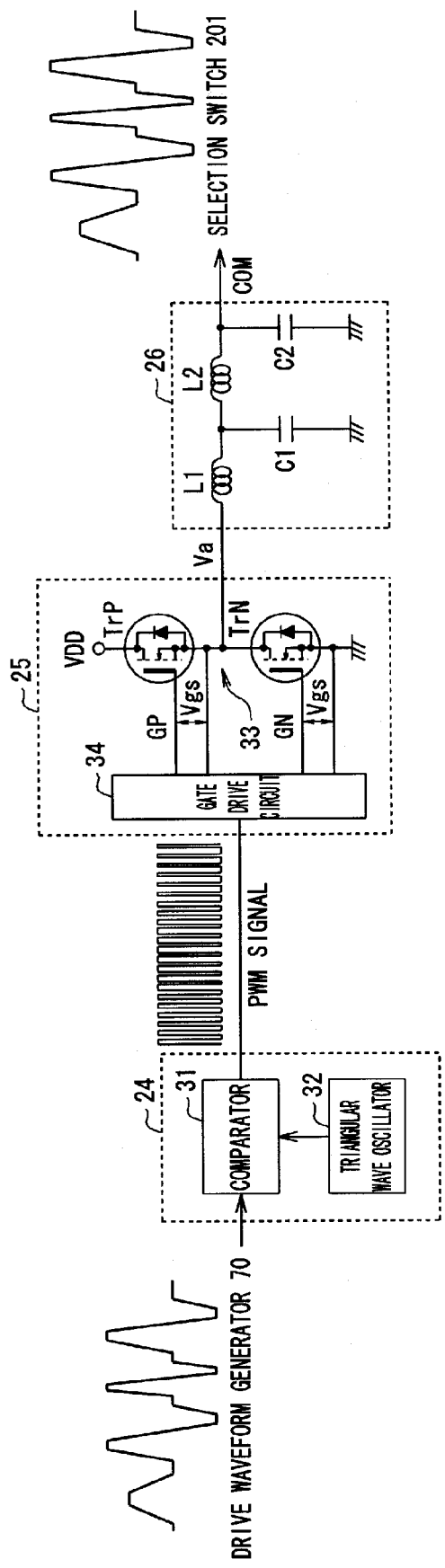
FIG. 9 is a block diagram showing details of a modulator, a digital power amplifier and a low pass filter of the drive signal output circuit in FIG. 7.
Figure 10:
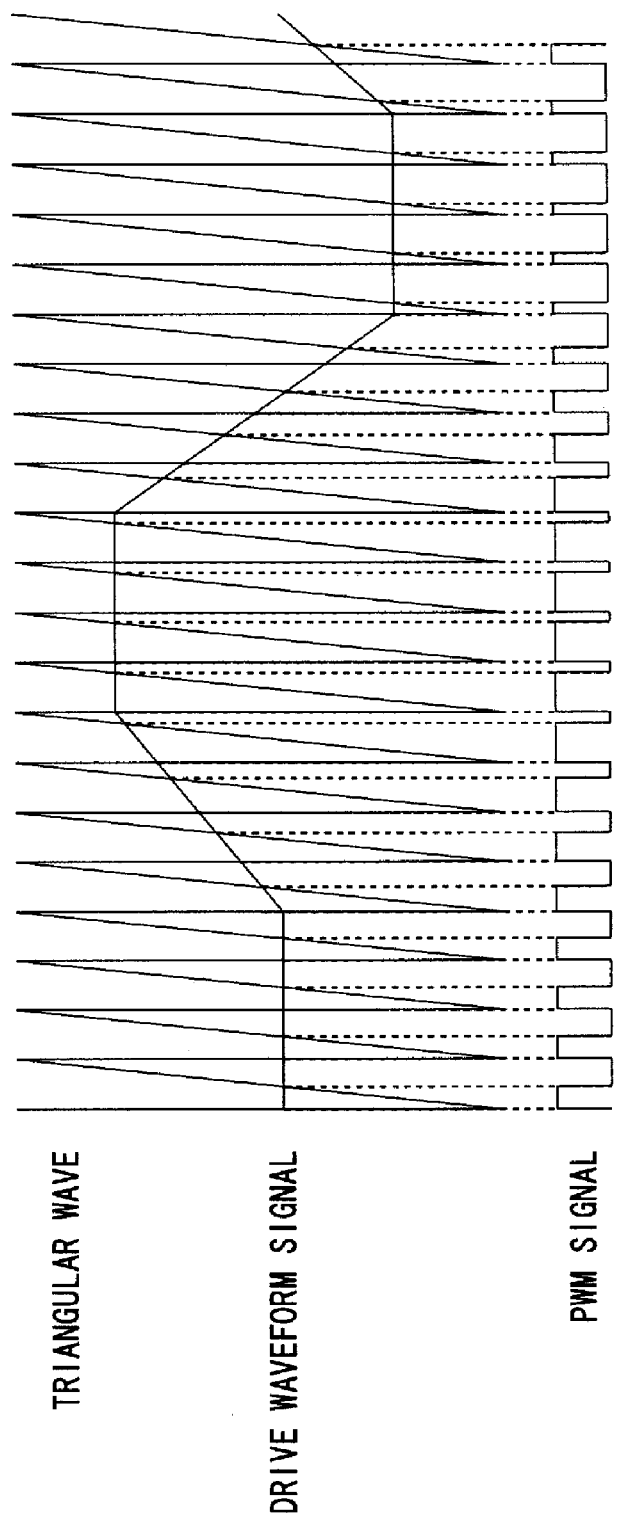
FIG. 10 is a diagram illustrating the operation of the modulator in FIG. 9.

FIG. 9 shows specific configuration between the modulator 24 of the drive signal output circuit and the low pass filter 26 described above. A general pulse width modulator (PWM) is used for the modulator 24 for modulating a pulse of a drive waveform signal WCOM. The modulator 24 comprises a known triangular wave oscillator 32, and a comparator 31 for comparing a triangular wave outputted from the triangular wave oscillator 32 and the drive waveform signal WCOM. The modulator 24 outputs a modulated (PWM) signal Hi if the drive waveform signal WCOM is a triangular wave or above, and outputs a modulated (PWM) signal Lo if the drive waveform signal WCOM is below a triangular wave, as shown in FIG. 10. This embodiment employs a pulse width modulator as a modulator; instead, a pulse density modulator (PDM) can be employed.

Figure 11:
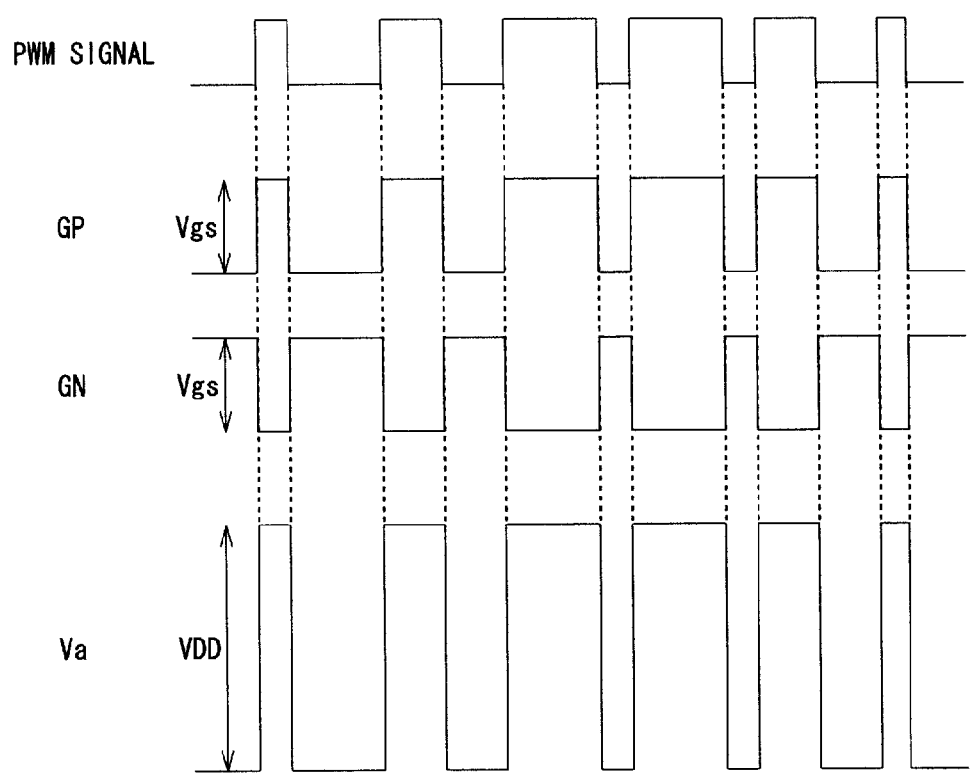
FIG. 11 is a diagram illustrating the operation of the digital power amplifier in FIG. 9.

The digital power amplifier 25 comprises a half bridge driver stage 33 including both a MOSFETTrP and a MOSFETTrN to actually amplify power, and a gate drive circuit 34 for modifying the gate-source signals GP and GN of the MOSFETTrP and TrN based on a modulated (PWM) signal from the modulator 24. The half bridge driver stage 33 is push-pull combination of the high-side MOSFETTrP and the low-side MOSFETTrN. Label a gate-source signal f the high-side MOSFETTrP as GP, a gate-source signal of the low-side MOSFETPrN as GN, and output of the half bridge driver stage 33 as Va. FIG. 11 shows how GP, GN and Va change depending on a modulated (PWM) signal. A voltage value Vgs of the gate-source signals GP and GN of the respective MOSFETTrP and TrN is an enough voltage value to turn ON the MOSFETTrP and TrN.

When a modulated (PWM) signal is at a Hi level, the gate-source signal GP of the high-side MOSFETTrP is at a Hi level and the gate-source signal GN of the low-side MOSFETTrN is at a Lo level. Thus, the high-side MOSFETTrP is in the ON state and the low-side MOSFETTrN is in the OFF state. As a result, the output Va of the half bridge driver stage 33 becomes supply power VDD. Meanwhile, when a modulated (PWM) signal is at the Lo level, the gate-source signal GP of the high-side MOSFETTrP is at a Lo level, and the gate-source signal GN of the low-side MOSFETTrN is at a Hi level. Thus, the high-side MOSFETTrP is in the OFF state and the low-side MOSFETTrN is in the ON state. As a result, the output Va of the half bridge driver stage 33 is 0.

The output Va from the half bridge driver stage 33 of the digital power amplifier 25 is supplied as a drive signal COM to the selection switch 201 via the low pass filter 26. The low pass filter 26 is a low-pass filter including combination of two coils L1 and L2 and two capacitors C1 and C2. The low pass filter 26 being a low-pass filter is designed to sufficiently attenuate a high-frequency component, i.e., a amplified digital signal (PWM) component of the output Va from the half bridge driver stage 33 of the digital power amplifier 25 and not to attenuate a drive signal component COM (or drive waveform component WCOM).

As described above, when the MOSFETTrP and TrN of the digital power amplifier 25 are digitally driven, the MOSFETs operate as switch elements so that currents flow into the MOSFETs in the ON state. However, a drain-source resistance value is very small, hence the power loss hardly generates. On the other hand, no current flows into the MOSFETs in the OFF state so that the power loss does not generate.

Thus, the power loss of the digital power amplifier 25 is significantly small so that small MOSFETs can be used, dispensing with a cooling unit such as a cooling plate radiator. The efficiency is about 30% to linearly drive a transistor, while the efficiency of a digital power amplifier is 90% or more. A cooling plate radiator of a transistor should be of a size of a 60-mm square for a single transistor. Dispensing with such a cooling plate radiator is overwhelmingly advantageous in actual layout.

As described above, in the head drive apparatus of an ink jet printer according to this embodiment, the drive waveform generator 70 generates a drive waveform signal WCOM being standard of a signal to control drive of an actuator such as a piezoelectric element, the modulator 24 such as a pulse width modulator modulates a pulse of the generated drive waveform signal WCOM, the digital power amplifier 25 amplifies the power of the modulated signal subjected to the pulse modulation, and the low pass filter 26 smoothes the amplified digital signal subjected to the power amplification and supplies the signal as a drive signal to the actuator. Thus, filter characteristics of the low pass filter 26 are set to sufficiently smooth only a amplified digital signal component so that rapid rise and fall of a drive signal to the actuators are enabled and the digital power amplifier 25 with efficient power amplification can efficiently amplify the power of a drive signal. This dispenses with a cooling unit such as a cooling plate radiator.

Figure 12:
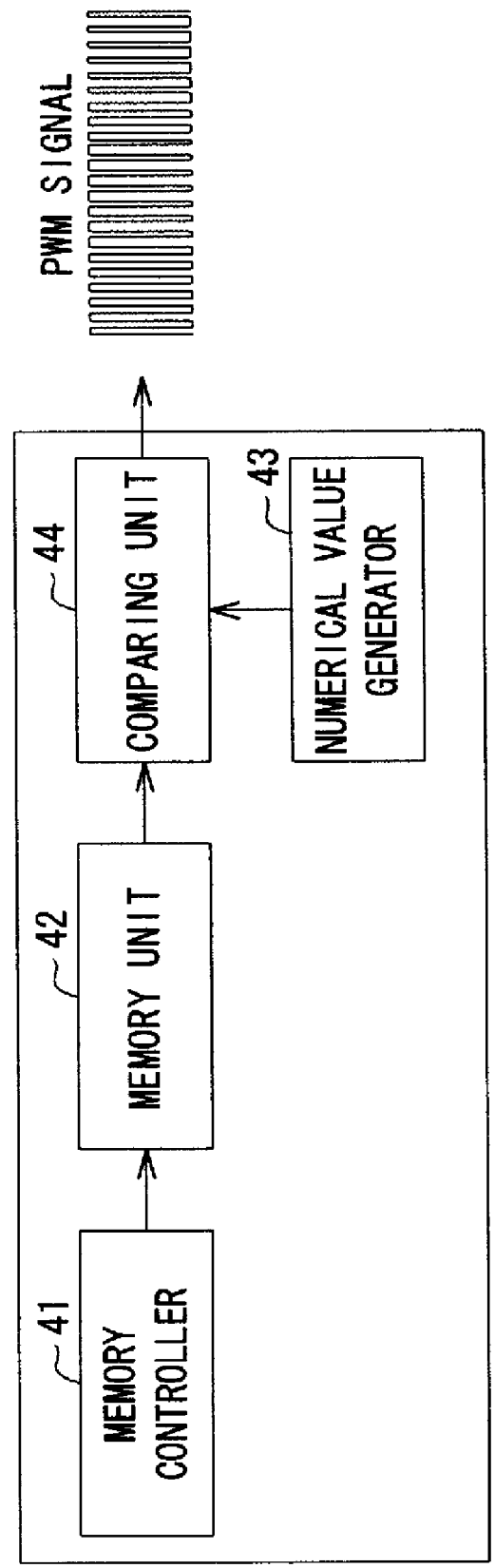
FIG. 12 shows another embodiment of the head drive apparatus of an ink jet printer according to the present invention, and is a block diagram of a drive waveform generator and a modulator.

FIG. 12 shows another embodiment of the drive waveform generator and the modulator of the head drive apparatus of an ink jet printer according to the present invention. In the drive waveform generator 70 in FIG. 3, the D/A converter 705 converts drive waveform signals subjected to digital composition into analog signals and outputs the result. On the other hand, in FIG. 12, a memory controller 51 reads out digital waveform data from a memory unit 52, a comparing unit 54 compares the read out digital waveform data with a numerical value from a numerical value generator 53 corresponding to a triangular wave to decide whether a modulated (PWM) signal is Hi or Lo, and outputs the result as a modulated (PWM) signal. In that case, since whole processing till output of a modulated (PWM) signal is performed digitally, the memory controller 51, the memory unit 52, the numerical value generator 53 and the comparing unit 54 can be embedded in a CPU or a gate array. The memory controller 51 and the memory unit 52 correspond to the drive waveform signal generation unit of the present invention, and the numerical value generator 53 and the comparing unit 54 constitute the modulator.

Figure 13:
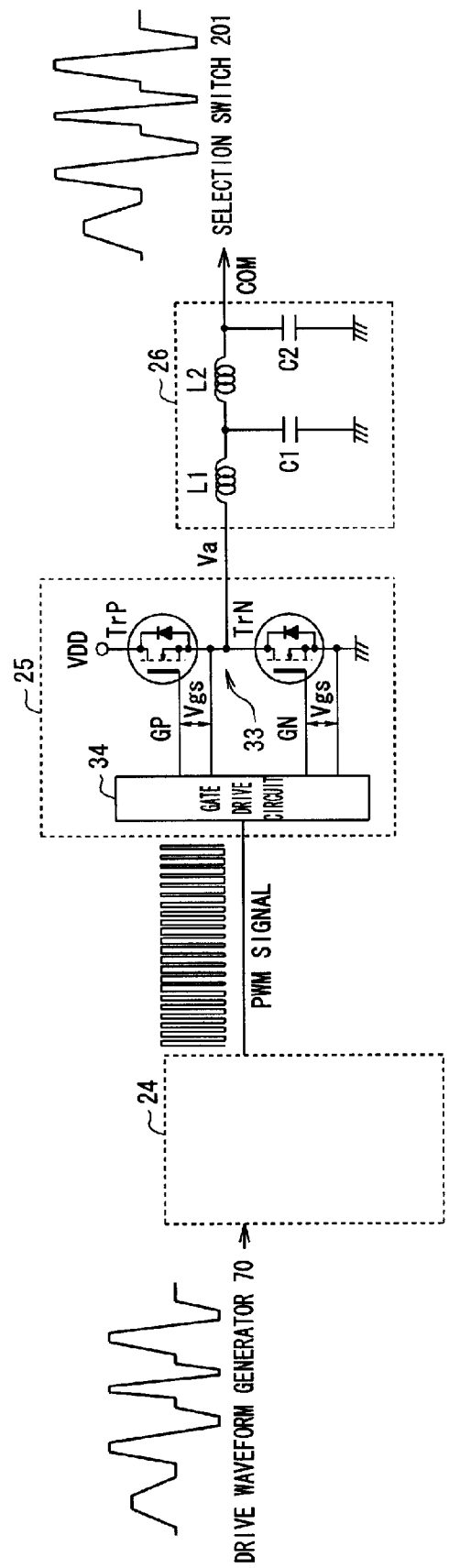
FIG. 13 shows a second embodiment of the line head ink jet printer to which the head drive apparatus of an ink jet printer according to the present invention is applied, and is a block diagram showing details of a modulator, a digital power amplifier and a low pass filter of a drive signal output circuit.

Next, a second embodiment of the head drive apparatus of an ink jet printer according to the present invention will be described. In this embodiment, the configuration between the modulator and the low pass filter of the drive signal output circuit in FIG. 9 according to the first embodiment is modified as in FIG. 13. Specifically, the internal configuration of the modulator 24 is modified. The internal configuration of the modulator 24 will be described below.

Figure 14:
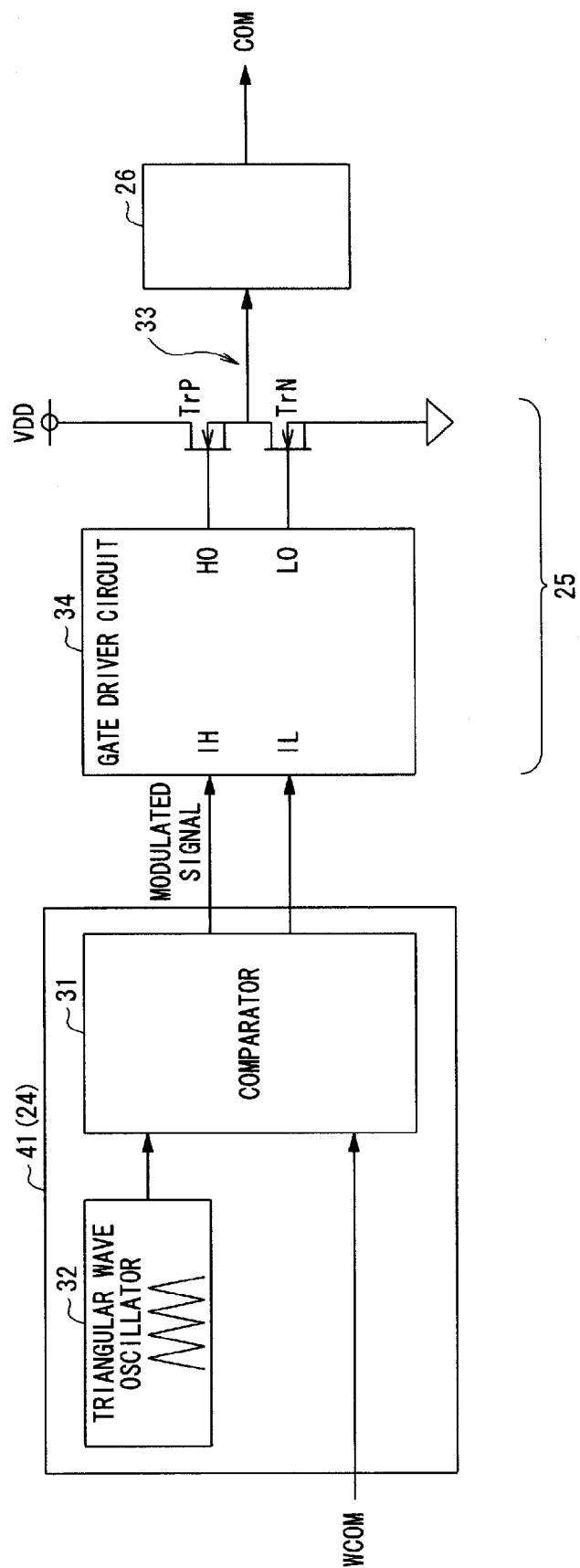
FIG. 14 is an overall configuration diagram of a drive signal output circuit using a triangular wave comparison pulse width modulator.

FIG. 14 shows overall configuration of a drive signal output circuit employing a triangular wave comparison pulse width modulator 41 as the modulator 24. The triangular wave comparison pulse width modulator 41 comprises the known triangular wave oscillator 32, and the comparator 31 for comparing a triangular wave outputted from the triangular wave oscillator 32 with the drive waveform signal WCOM. The triangular wave comparison pulse width modulator 41 outputs a modulated (PWM) signal Hi if the drive waveform signal WCOM is a triangular wave or above, and outputs a modulated (PWM) signal Lo if the drive waveform signal WCOM is below a triangular wave, as described above.

Figure 15:
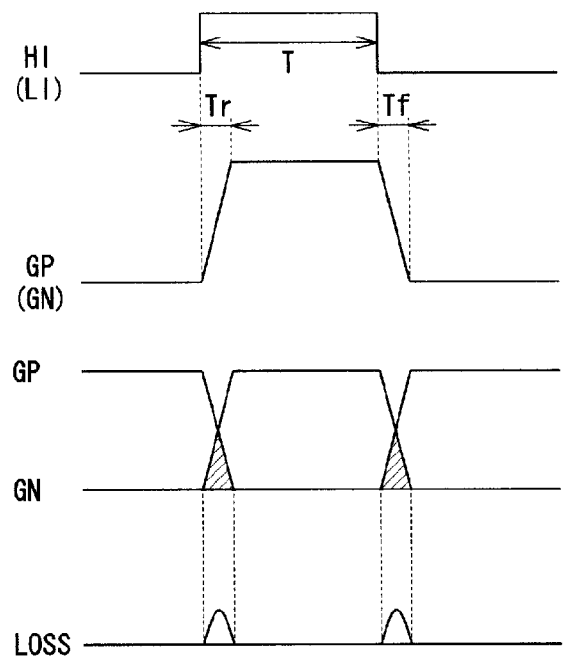
FIG. 15 is a diagram illustrating a MOSFET gate signal in a digital power amplifier with the triangular wave comparison pulse width modulator.

Modulated signals from the triangular wave comparison pulse width modulator 41 are referred to as IH and IL. As shown in FIG. 15, even if the modulated signals IH and IL are complete rectangular waves (pulses) output signals of a gate driver 34, i.e., gate signals GP and GN of the MOSFET TrP and TrN rise during a short time Tr and fall during a short time Tf so that the signals change to trapezoid waves. As described above, the gate signals GP and GN are in opposite directions (i.e., reversed) at a time so that the two gate signals GP and GN sometimes overlap with each other. When the gate signals GP and GN overlap with each other, the MOSFET TrP and TrN of the half bridge driver stage 33 simultaneously turn to the ON state and a shoot-through current flows into them, causing power loss. The power loss is referred to as transition loss or switching loss. The power loss occurs whenever the MOSFET TrP and TrN turn ON/OFF so that it is larger as a frequency is higher.

Figure 16:
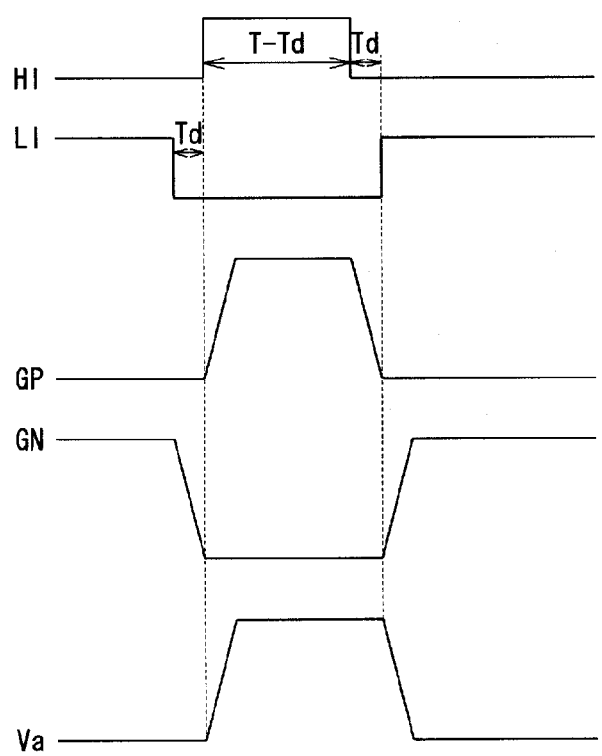
FIG. 16 is a diagram illustrating a MOSFET gate signal and an output signal in the digital power amplifier if dead time is set.

To avoid the above circumstances, as shown in FIG. 16, a dead time Td can be set for the modulated signals IH and IL to be inputted to the gate driver 34 at different times so that the gate signals GP and GN from the gate driver 34 do not actually overlap with each other. However, a time when one of the gate signals GP and GN of the MOSFET TrP and TrN is ON (Hi) is shorter than a time when the modulated signals IH and IL are ON (Hi). That is, output Va of the half bridge driver stage 33 is 0 in a low ON-duty (=high OFF-duty) area, while the output Va of the half bridge driver stage 33 is VDD in a low OFF-duty (=high ON-duty) area.

Figure 17:
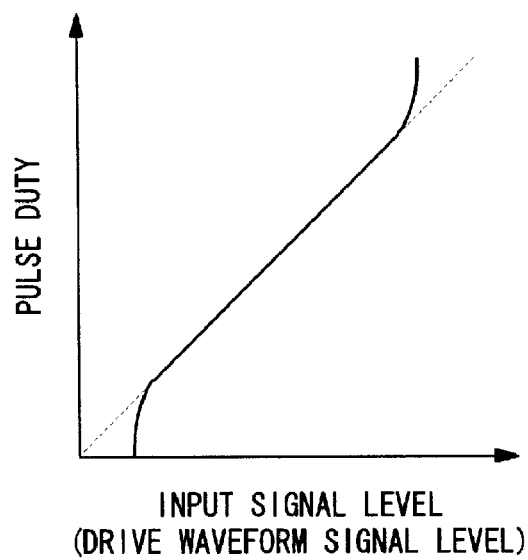
FIG. 17 is a diagram illustrating the relation between an input signal level and pulse duty according to the gate signal in FIG. 16.
Figure 18:
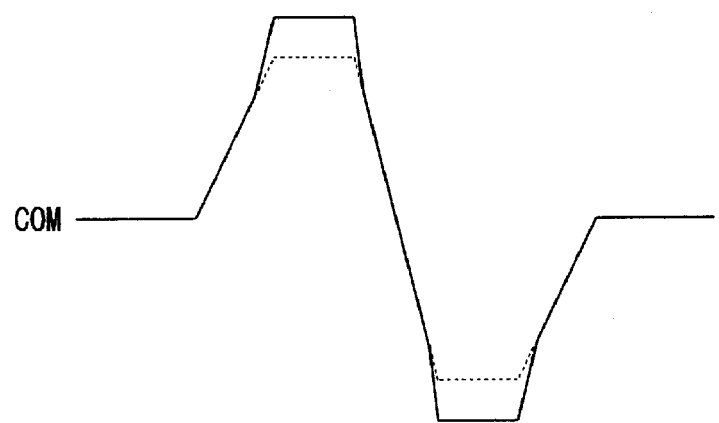
FIG. 18 is a diagram illustrating distortion of a drive signal according to the pulse duty in FIG. 17.

Regard the above as the relation between an input signal level, i.e., drive waveform signal level and pulse duty. As shown by a broken line in FIG. 17, a drive waveform signal level and pulse duty should be originally linear. However, pulse duty is not linear in an area of a low or high drive waveform signal level as shown by a solid line in FIG. 17, causing distortion of a drive signal COM shown by a solid line in FIG. 18.

Figure 19:
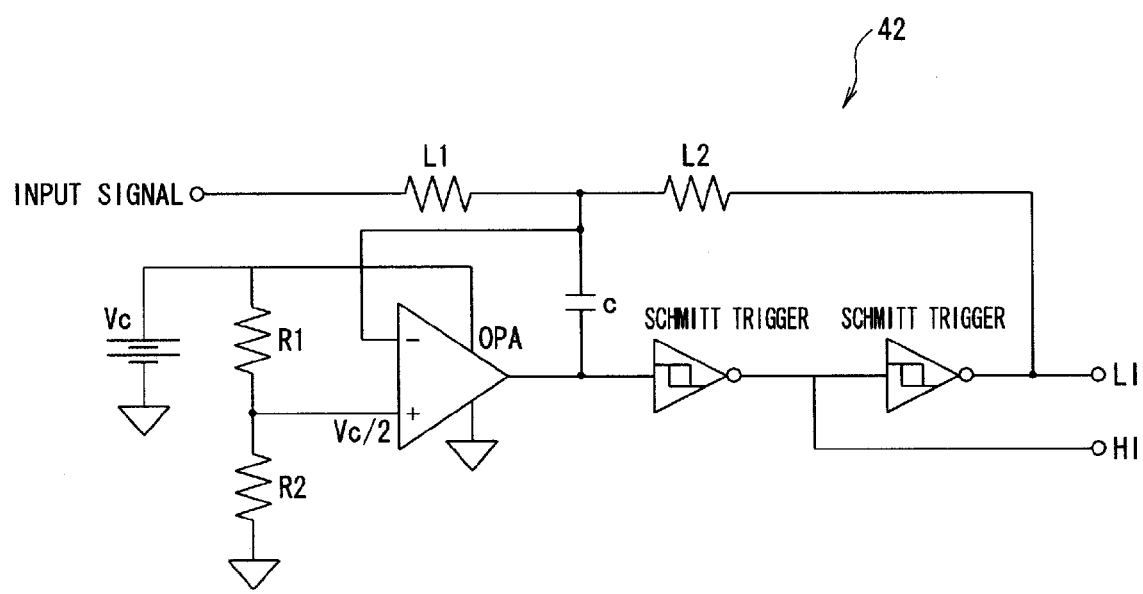
FIG. 19 is a diagram illustrating one example of a self-oscillating pulse width modulator.
Figure 20:
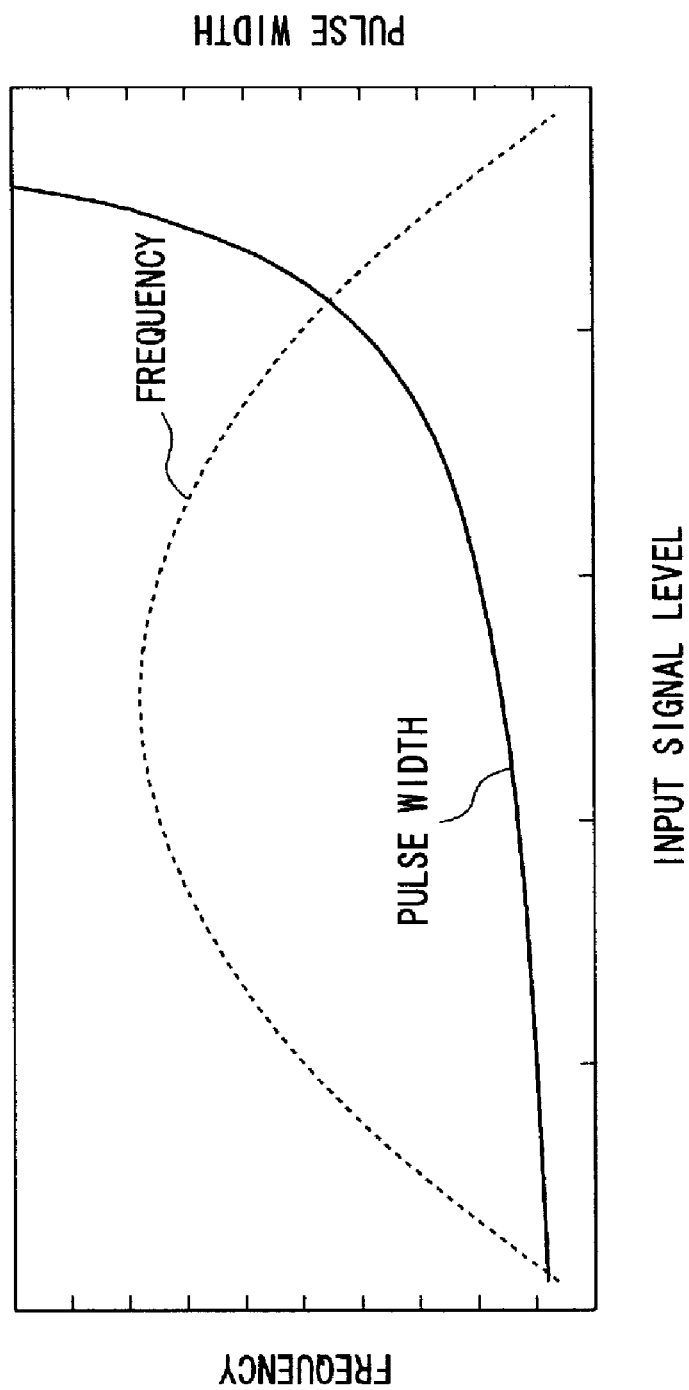
FIG. 20 is a diagram illustrating frequency and pulse width characteristics in self-oscillating pulse width modulation.

Meanwhile, a self-oscillating pulse width modulator (PWM) can widen the pulse width in an area of a low or high drive waveform signal level. As a result, the circuit has an advantage of generating a amplified digital signal of the half bridge driver stage 33. FIG. 19 shows one example of a self-oscillating pulse width modulator 42. FIG. 20 shows output characteristics of the self-oscillating pulse width modulator 42. In the self-oscillating pulse width modulator 42, when a level of an input signal, or a drive waveform signal WCOM in this case is low, the frequency of a triangular wave is low. As a result, the pulse width of a modulated signal can be large in an area of a low input signal level of the input signal, i.e., drive waveform signal WCOM. This can cause generation of a amplified digital signal of the half bridge driver stage 33. On the contrary, in the self-oscillating pulse width modulator 42, the frequency of a triangular wave is large and the operation frequency of the switching transistor is also large at the median of input signal levels of an input signal, or a drive waveform signal WCOM in this case, i.e., around duty ratio 50%, increasing switching loss as described above. Further, a frequency band of a high frequency component of output Va is wide so that it is difficult to design a low pass filter in a latter part.

Figure 21:
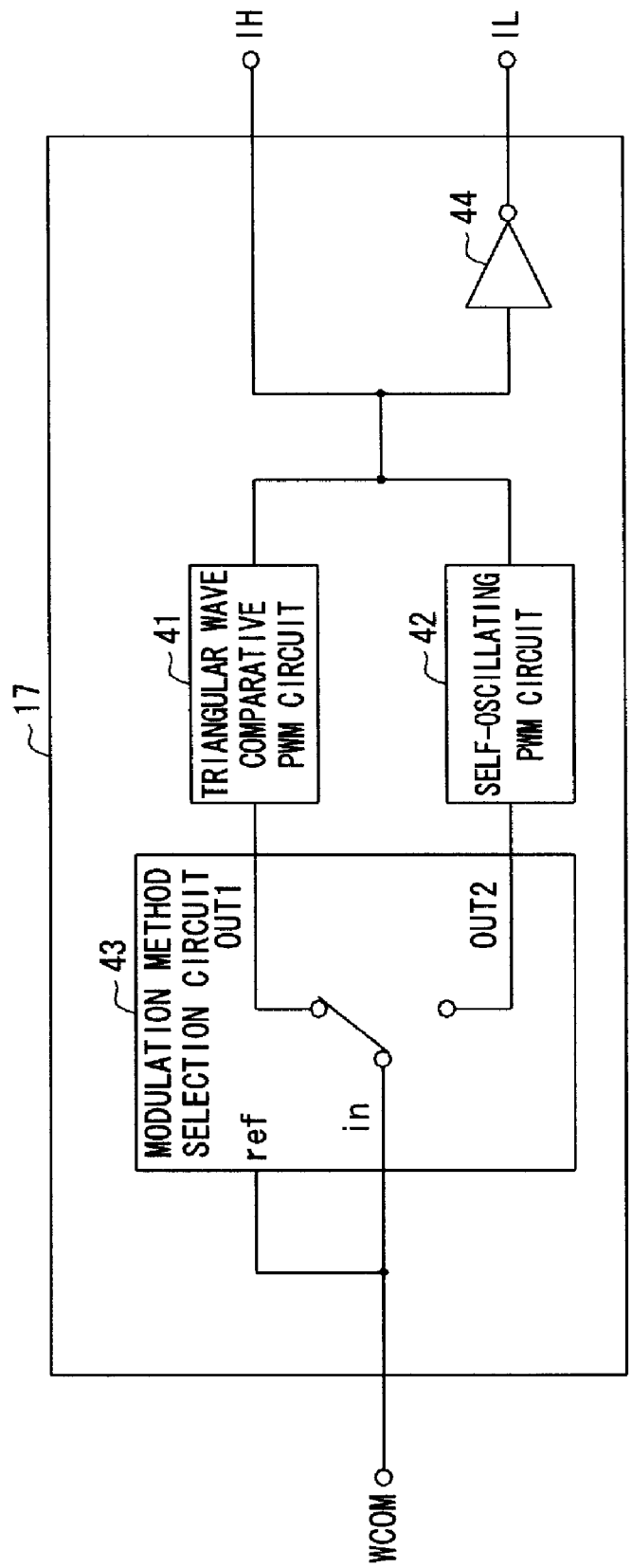
FIG. 21 is a block diagram of the modulator in FIG. 13.
Figure 22:
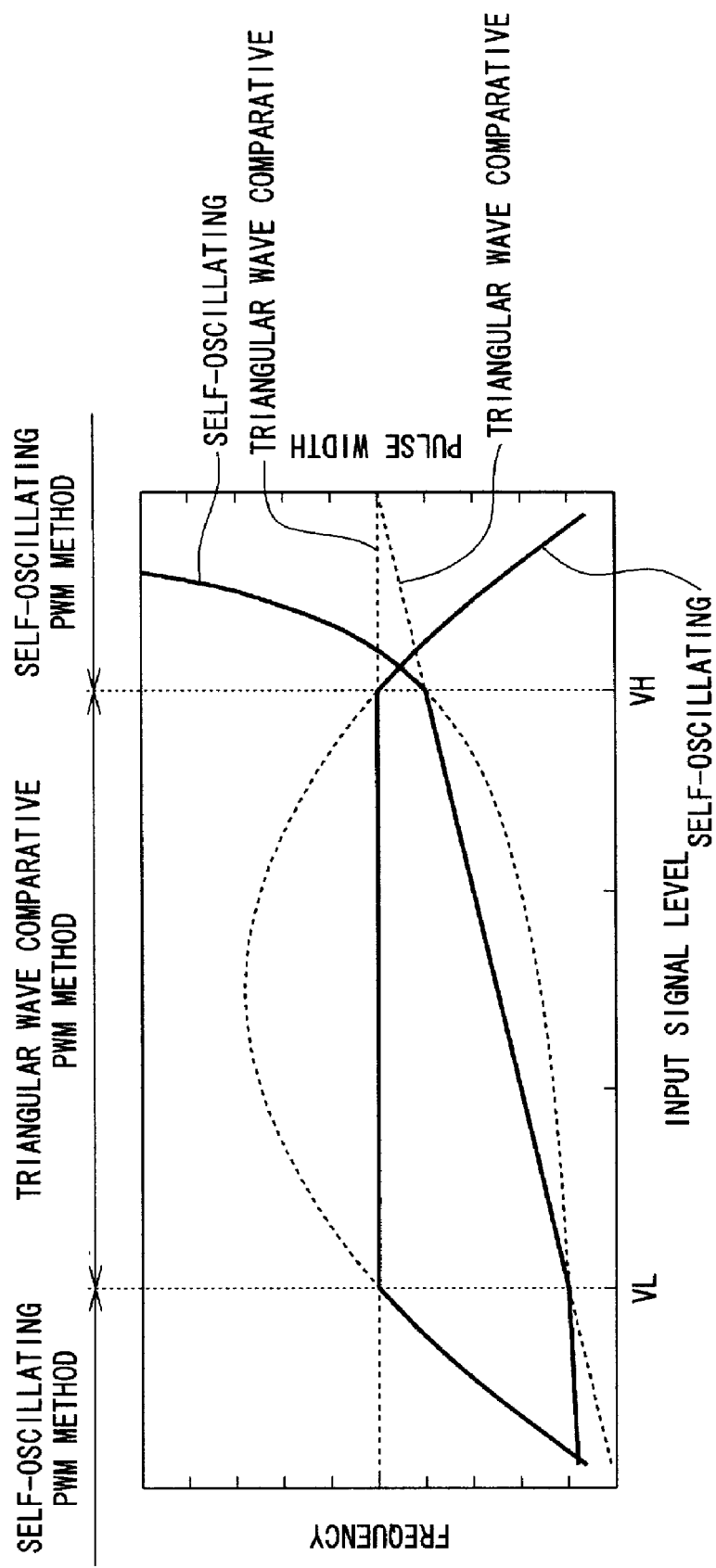
FIG. 22 is a diagram illustrating frequency and pulse width characteristics in the pulse width modulation in FIG. 21.

In view of the above, according to this embodiment, the triangular wave comparison pulse width modulator 41 and the self-oscillating pulse width modulator 42 are arranged to be together in the modulator 24, as shown in FIG. 21. A drive waveform signal WCOM is inputted to one of the pulse width modulators selected by a modulation method selection circuit 43. Output from the modulator is labeled as a modulated signal IH, while an output being further reversed by an inverter 44 is labeled as a modulated signal IL. The modulation method selection circuit 43 selects a pulse width modulator by referring to the drive waveform signal WCOM itself. Specifically, it selects a triangular wave comparison pulse width modulation (PWM) method if an input signal level of the drive waveform signal WCOM is in a pre-determined area between a low voltage pre-determined value VL and a high voltage pre-determined value VH, and selects a self-oscillating pulse width modulation (PWM) method if the drive waveform signal WCOM is in an area smaller or larger than the pre-determined area, as shown in FIG. 22.

As described above, in the head drive apparatus of an ink jet printer according to this embodiment, the drive waveform generator 70 generates a drive waveform signal WCOM being standard of a signal to control drive of an actuator such as a piezoelectric element, the modulator 24 such as a pulse width modulator modulates a pulse of the generated drive waveform signal WCOM, the digital power amplifier 25 amplifies the power of the modulated signal subjected to the pulse modulation, and the low pass filter 26 smoothes the amplified digital signal subjected to the power amplification and supplies the signal as a drive signal to the actuator. Thus, filter characteristics of the low pass filter 26 are set to sufficiently smooth only a high frequency component of a amplified digital signal so that a correct drive signal can be generated to the actuators and the digital power amplifier 25 with efficient power amplification can efficiently amplify the power of a drive signal. This dispenses with a cooling unit such as a cooling plate radiator.

A pulse modulation method can be changed depending on an input signal level of a drive waveform signal. Thus, a self-oscillating pulse width modulation method is used in a low ON-duty (=high OFF-duty) area, that is an area with a low input signal level of a drive waveform signal, and a low OFF-duty (=high ON-duty) area, that is an area with a high input signal level of a drive waveform signal. In the other areas, a triangular wave comparison pulse width modulation method is used. This can inhibit or prevent distortion of an output signal and power loss.

Figure 23:
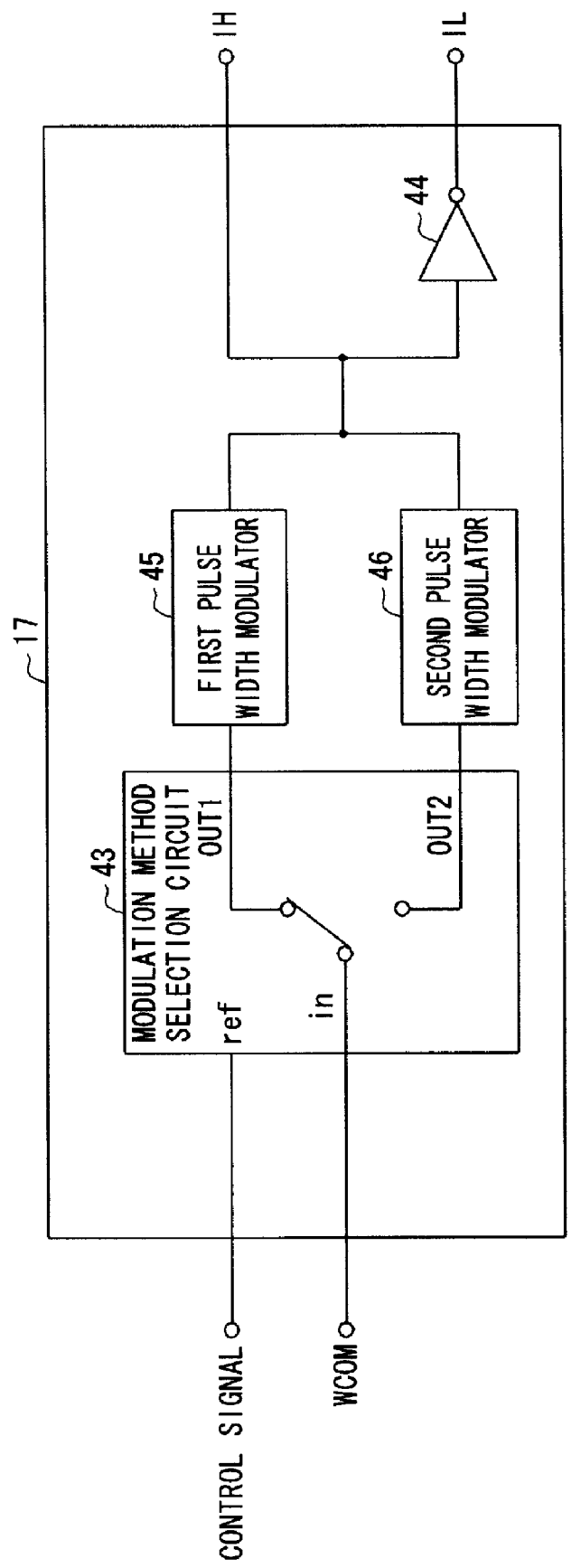
FIG. 23 is a block diagram of a modulator showing another embodiment of the head drive apparatus of an ink jet printer according to the present invention.

FIG. 23 shows another example of the modulator 24 as another embodiment of the head drive apparatus of an ink jet printer according to the present invention. According to this embodiment, a first pulse width modulator 45 and a second pulse width modulator 46 employing different pulse width modulation methods are arranged to be adjacent to each other in the modulator 24. A drive waveform signal WCOM is inputted to one of the pulse width modulators selected by a modulation method selection circuit 43. Output from the modulator is labeled as a modulated signal IH, while an output being further reversed by an inverter 44 is labeled as a modulated signal IL. The modulation method selection circuit 43 is configured to select the first pulse width modulator 45 or the second pulse width modulator 46 depending on each control signal. A pulse width modulation method to be selected is not limited to the triangular wave comparative or self-oscillating described above. A method of selecting a pulse width modulation method can also depend on each control signal.

In the embodiments, examples have been described in detail to apply the head drive apparatus of an ink jet printer according to the present invention to a line head ink jet printer. However, the head drive apparatus of an ink jet printer according to the present invention can be applied to all types of ink jet printers including a multipass printer.

What is claimed is:

1. A head drive apparatus of a liquid jet apparatus having:
a nozzle for jetting liquid drops;
an actuator provided in correspondence to the nozzle; and
a drive unit that applies a drive signal to the actuator,
wherein the drive unit comprises:
a drive waveform generator that generates a drive waveform signal being an input for generating the drive signal;
a modulator that modulates a pulse of the drive waveform signal generated by the drive waveform generator;
a digital power amplifier for amplifying power of a modulated signal subjected to the pulse modulation by the modulator; and
a low pass filter for smoothing an amplified digital signal subjected to the power amplification by the digital power amplifier and supplying the signal as the drive signal to the actuator,
wherein the modulator comprises a pulse modulation method selection unit that selects a pulse modulation method depending on an input signal level of the drive waveform signal or a type of drive waveform signal, a first pulse modulation method having a constant pulse frequency regardless of the input signal level of the drive waveform signal, and a second pulse modulation method for changing a pulse frequency in accordance with the input signal level of the drive waveform signal, and
wherein the pulse modulation method selection unit selects any one of the first pulse modulation method and the second pulse modulation method, by referring to the input signal level of the drive waveform signal.

2. The head drive apparatus of an ink jet printer according to claim 1, wherein the pulse modulation method changing unit uses a triangular wave comparison pulse width modulation method for pulse modulation if the input signal level of the drive waveform signal is in a preset range, and uses a self-oscillating pulse width modulation method for pulse modulation if the input signal level of the drive waveform signal is in a range lower than the preset range.

3. The head drive apparatus of an ink jet printer according to claim 1, wherein the pulse modulation method changing unit uses a triangular wave comparison pulse width modulation method for pulse modulation if the input signal level of the drive waveform signal is in a preset range, and uses a self-oscillating pulse width modulation method for pulse modulation if the input signal level of the drive waveform signal is in a range higher than the preset range.

4. A head drive control method for an ink jet printer wherein a drive of an actuator is controlled by:
generating a drive waveform signal being an input for generating the drive signal to control drive of the actuator provided in correspondence to a nozzle for jetting liquid drops;
modulating a pulse of the previously generated drive waveform signal and selecting a pulse modulation method for pulse modulating the drive waveform signal between a first pulse modulation method and a second pulse modulation method based on the input signal level of the drive waveform signal, the first pulse modulation method having a constant pulse frequency regardless of the input signal level of the drive waveform signal, and the second pulse modulation method for changing a pulse frequency in accordance with the input signal level of the drive waveform signal;
amplifying power of a modulated signal subjected to the pulse modulation by a digital power amplifier; and
smoothing an amplified digital signal subjected to the power amplification by the digital power amplifier and supplying the signal as a drive signal to the actuator.

5. The head drive control method for an ink jet printer according to claim 4, wherein a pulse is modulated by using a triangular wave comparison pulse width modulation method if the input signal level of the drive waveform signal is in a preset range, and a pulse is modulated by using a self-oscillating pulse width modulation method if the input signal level of the drive waveform signal is in a range lower or higher than the preset range.

6. An ink jet printer comprising the head drive apparatus according to claim 1.

7. A head drive apparatus of a liquid jet apparatus having:
a nozzle for jetting liquid drops;
an actuator provided in correspondence to the nozzle; and
a drive unit that applies a drive signal to the actuator,
wherein the drive unit comprises:
a drive waveform generator that generates a drive waveform signal being an input for generating the drive signal;
a modulator that modulates a pulse of the drive waveform signal generated by the drive waveform generator;
a digital power amplifier for amplifying power of a modulated signal subjected to the pulse modulation by the modulator; and
a low pass filter for smoothing an amplified digital signal subjected to the power amplification by the digital power amplifier and supplying the signal as the drive signal to the actuator,
wherein the modulator comprises a pulse modulation method selection unit that selects a pulse modulation method depending on an input signal level of the drive waveform signal, a first pulse modulation circuit that is a triangular wave comparison pulse width modulator, and a second pulse modulation circuit having a pulse frequency different from that of the triangular wave comparison pulse width modulator, and
wherein the pulse modulation method selection unit selects any one of the first pulse modulation circuit and the second pulse modulation circuit, by referring to the input signal level of the drive waveform signal.

8. The head drive apparatus of an ink jet printer according to claim 7,
wherein the second pulse modulation circuit is a self-oscillating pulse width modulator, and
wherein the pulse modulation method changing unit uses a triangular wave comparison pulse width modulation method for pulse modulation if the input signal level of the drive waveform signal is in a preset range, and uses a self-oscillating pulse width modulation method for pulse modulation if the input signal level of the drive waveform signal is in a range lower than the preset range.

9. The head drive apparatus of an ink jet printer according to claim 8,
wherein the second pulse modulation circuit is a self-oscillating pulse width modulator, and
wherein the pulse modulation method changing unit uses a triangular wave comparison pulse width modulation method for pulse modulation if the input signal level of the drive waveform signal is in a preset range, and uses a self-oscillating pulse width modulation method for pulse modulation if the input signal level of the drive waveform signal is in a range higher than the preset range.

* * * * *